US008861258B2

(12) United States Patent
Lan et al.

(10) Patent No.: US 8,861,258 B2
(45) Date of Patent: Oct. 14, 2014

(54) SET/RESET ALGORITHM WHICH DETECTS AND REPAIRS WEAK CELLS IN RESISTIVE-SWITCHING MEMORY DEVICE

(71) Applicant: SanDisk 3D LLC, Milpitas, CA (US)

(72) Inventors: Zhida Lan, San Jose, CA (US); Roy E Scheuerlein, Cupertino, CA (US); Thomas Yan, San Jose, CA (US)

(73) Assignee: SanDisk 3D LLC, Milpitas, CA (US)

( * ) Notice: Subject to any disclaimer, the term of this patent is extended or adjusted under 35 U.S.C. 154(b) by 106 days.

(21) Appl. No.: 13/772,729

(22) Filed: Feb. 21, 2013

(65) Prior Publication Data

US 2014/0233299 A1 Aug. 21, 2014

(51) Int. Cl.
G11C 13/00 (2006.01)
G11C 11/56 (2006.01)

(52) U.S. Cl.
CPC ........ G11C 13/0069 (2013.01); G11C 11/5678 (2013.01); G11C 13/0064 (2013.01)
USPC ............ 365/148; 365/158; 365/163; 365/200

(58) Field of Classification Search
CPC ........... G11C 11/5678; G11C 13/0002; G11C 13/0004; G11C 13/0064; G11C 13/0069
USPC .................. 365/148, 158, 163, 200
See application file for complete search history.

(56) References Cited

U.S. PATENT DOCUMENTS

| | | | |
|---|---|---|---|
| 7,110,303 B2 | 9/2006 | Schubert | |
| 7,224,598 B2 | 5/2007 | Perner | |
| 7,286,388 B1 | 10/2007 | Chen et al. | |
| 7,715,258 B2 | 5/2010 | Symanczyk et al. | |
| 7,746,688 B2 * | 6/2010 | Kim et al. | 365/163 |
| 7,751,233 B2 * | 7/2010 | Kang et al. | 365/163 |
| 7,830,015 B2 | 11/2010 | Lan et al. | |
| 8,000,132 B2 * | 8/2011 | Kang et al. | 365/163 |
| 8,144,499 B2 | 3/2012 | Kitagawa et al. | |
| 8,184,470 B2 | 5/2012 | Toda et al. | |
| 8,254,183 B2 | 8/2012 | Park | |
| 8,300,449 B2 | 10/2012 | Lin et al. | |
| 8,345,465 B2 | 1/2013 | Muraoka et al. | |
| 8,787,065 B2 * | 7/2014 | Torsi | 365/148 |
| 2008/0273371 A1 | 11/2008 | Philipp et al. | |
| 2012/0120710 A1 | 5/2012 | Rabkin et al. | |
| 2012/0201069 A1 | 8/2012 | Honda | |

OTHER PUBLICATIONS

Higuchi, Kazuhide, et al., "50nm HfO2 ReRAM with 50-Times Endurance Enhancement by Set/Reset Turnback Pulse & Verify Scheme," Extended Abstracts of the 2011 International Conference on Solid State Devices and Materials, Nagoya, Jun. 2011, pp. 1011-1012.

* cited by examiner

*Primary Examiner* — Tan T. Nguyen
(74) *Attorney, Agent, or Firm* — Vierra Magen Marcus LLP

(57) ABSTRACT

A resistance-switching memory cell is programmed in a set or reset operation which tests the stability of the cell. A first programming phase using program voltages which increase in magnitude or duration until a program verify test is passed. A stability test phase is then performed to evaluate a stability of the memory cell. The stability test phase determines whether the memory cell is weak and likely to transition out of the set or reset state by applying one or more disturb pulses and performing one or more stability verify tests. The disturb pulses can have a reduced magnitude or duration compared to the program voltages. If the stability test phase indicates the memory cell is not stable, a second programming phase is performed. If the stability test phase indicates the memory cell is stable, the operation is concluded.

24 Claims, 17 Drawing Sheets

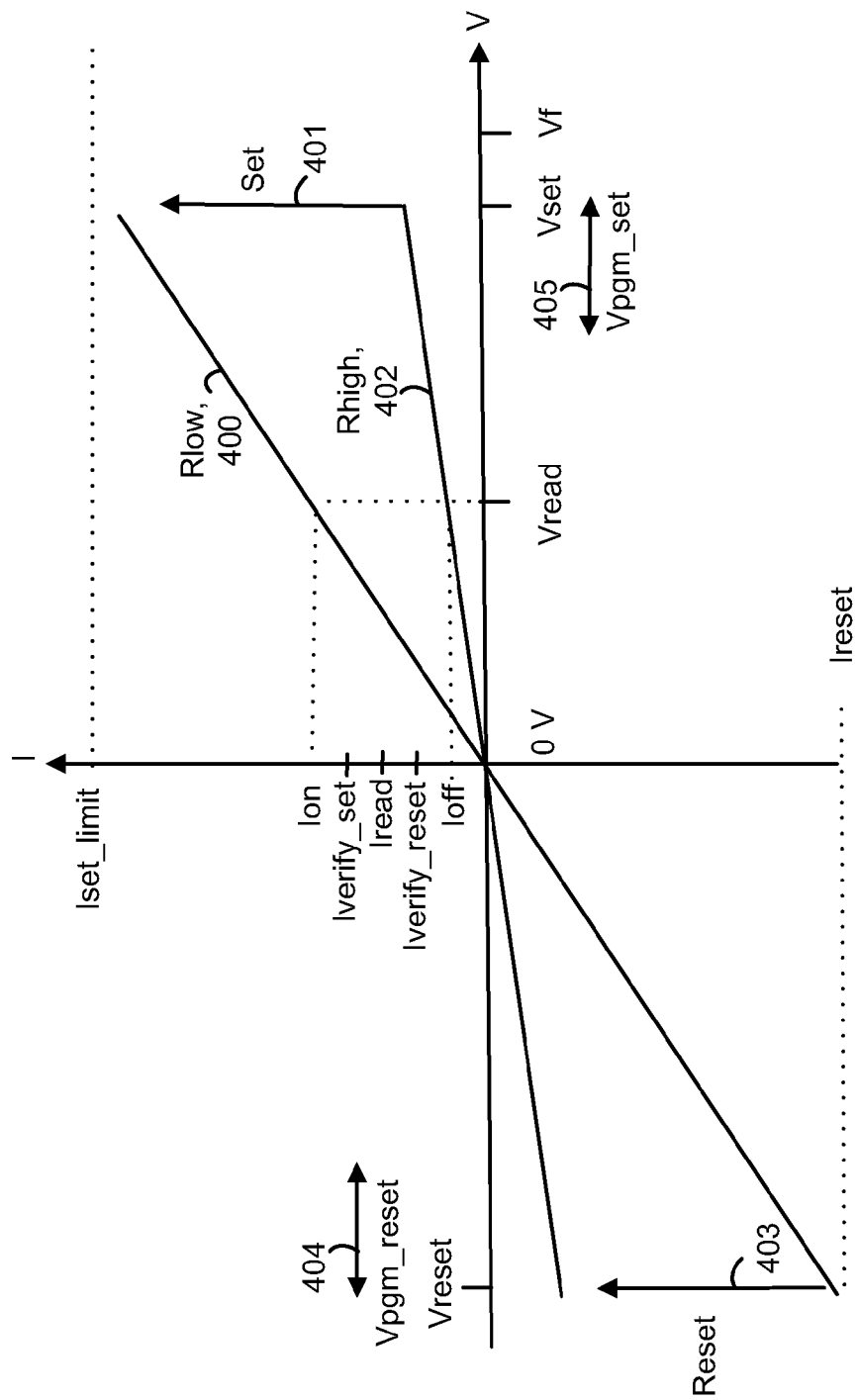

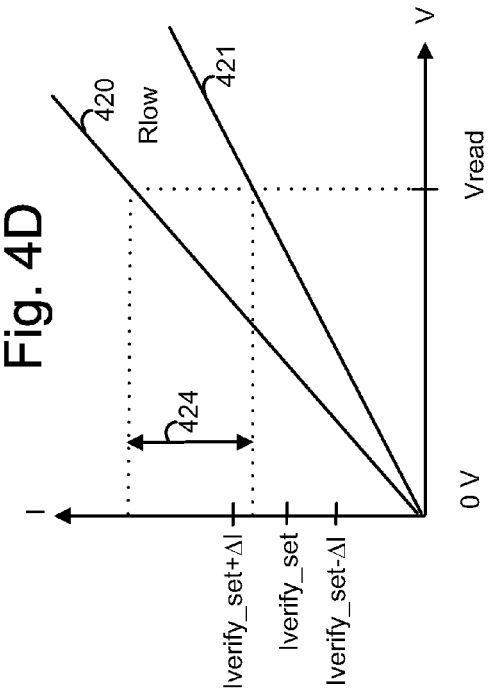
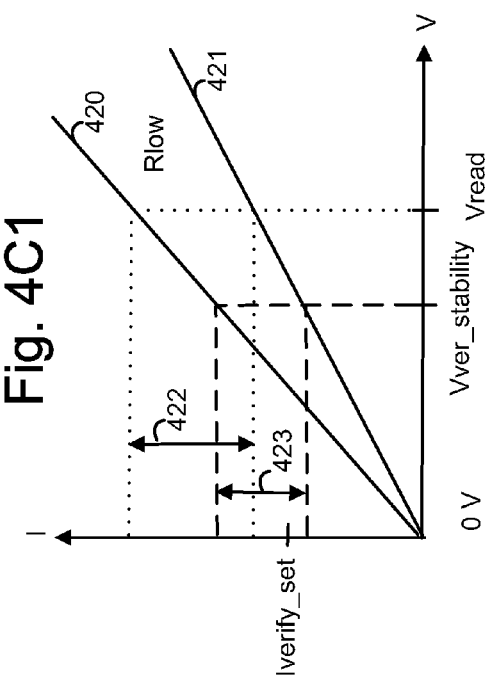
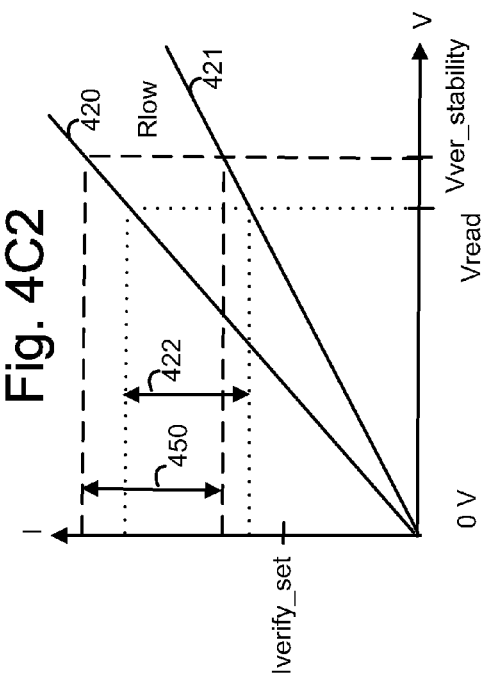

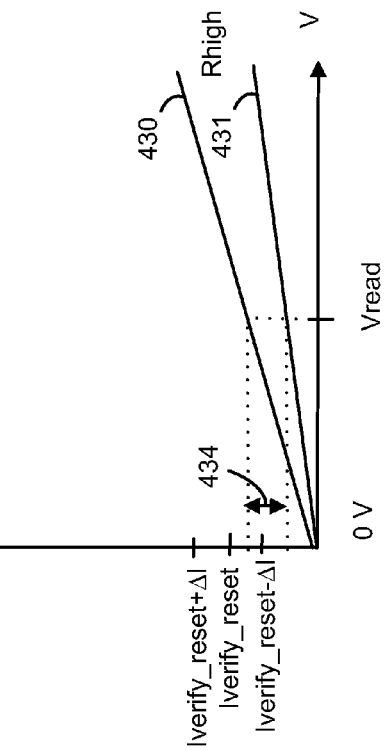
Fig. 4F
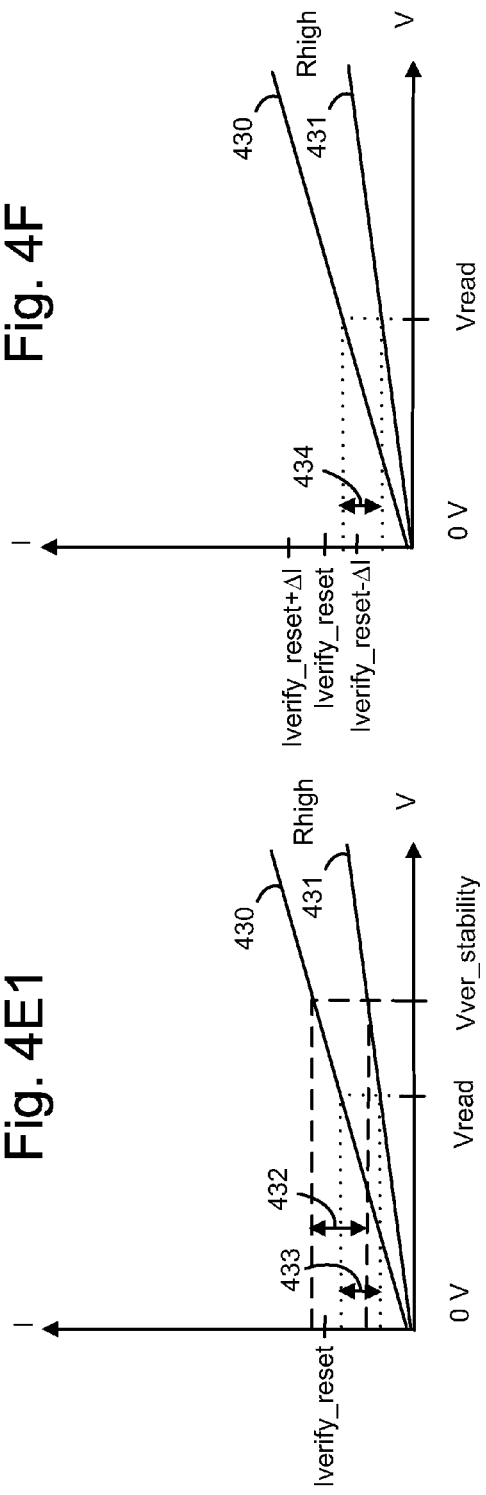
Fig. 4E1
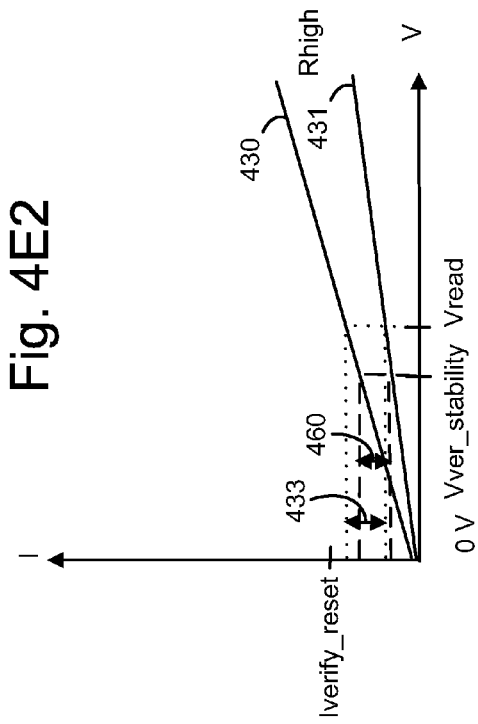
Fig. 4E2

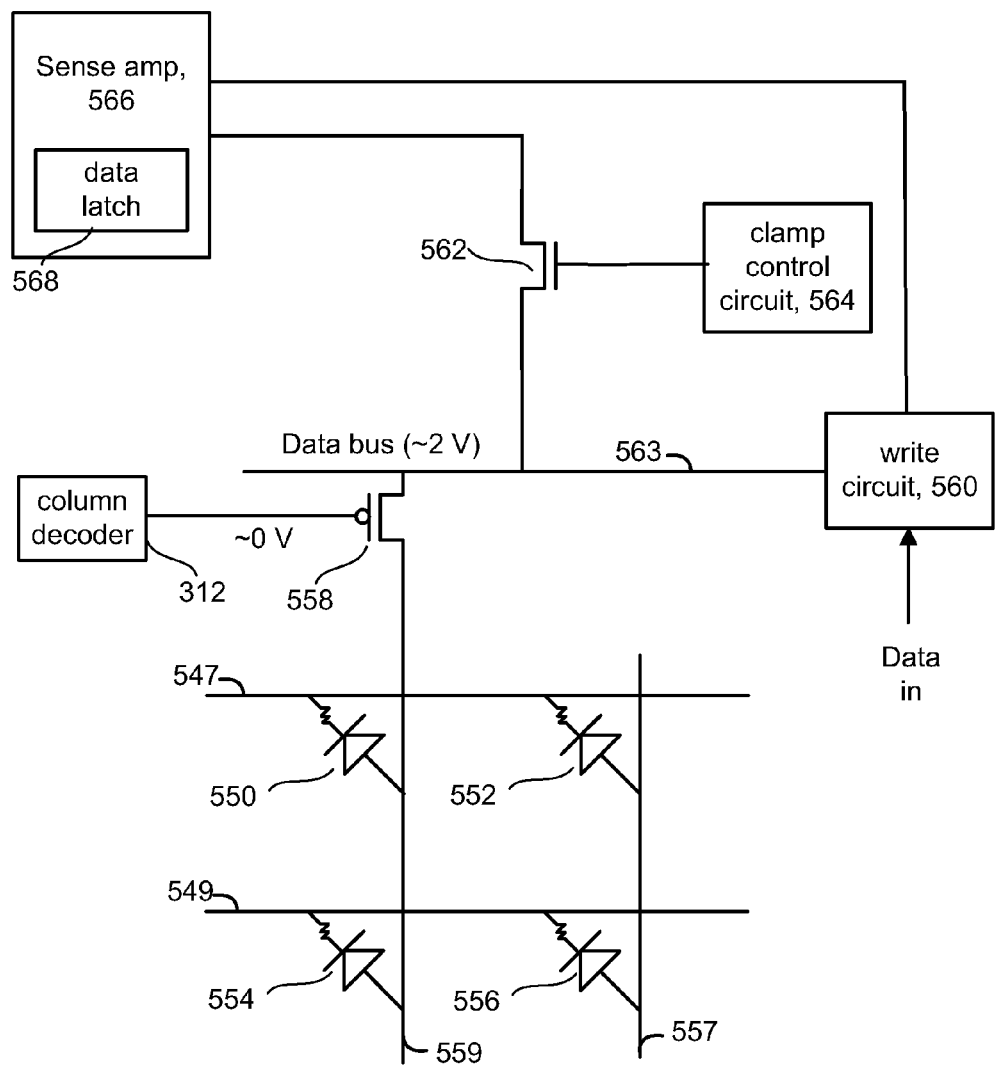

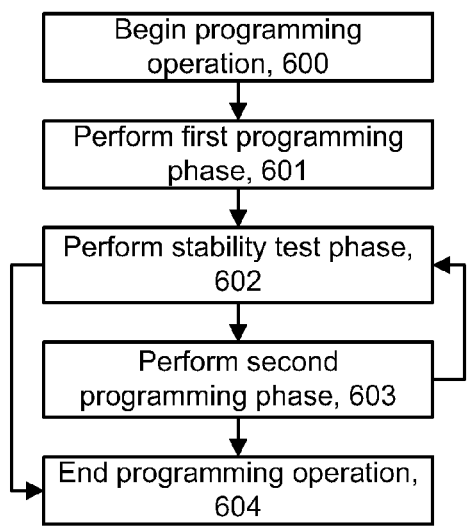
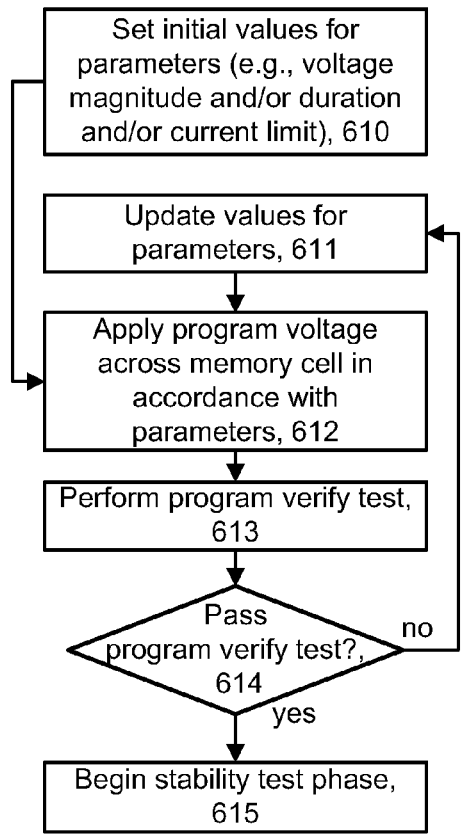
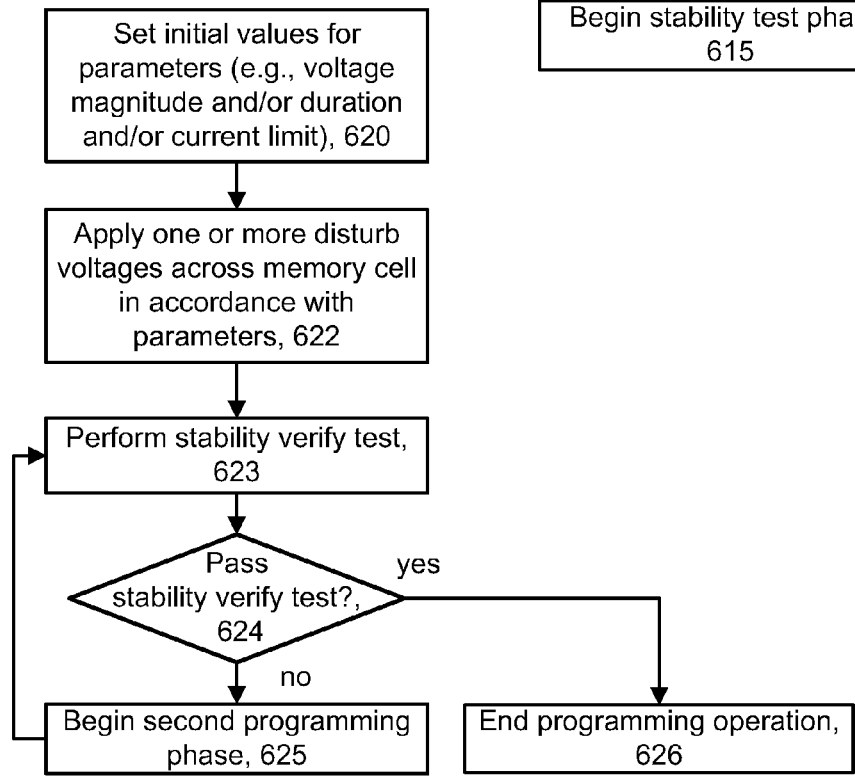
Fig. 6A
Fig. 6B
Fig. 6C

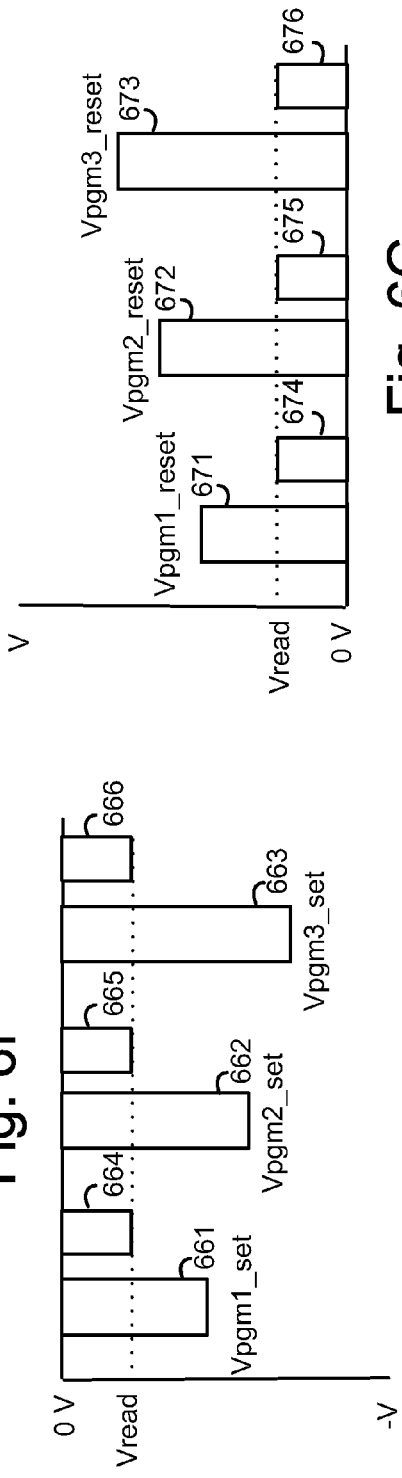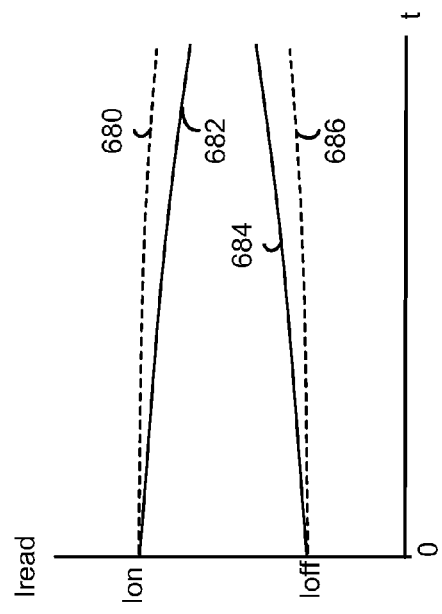

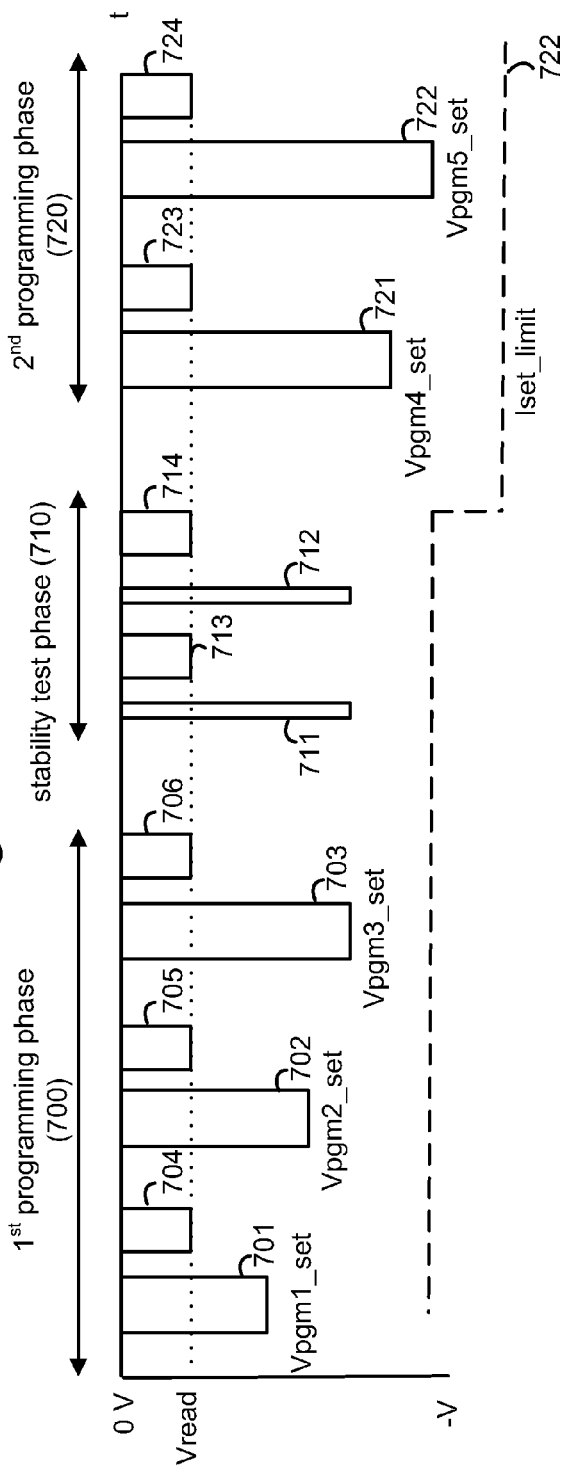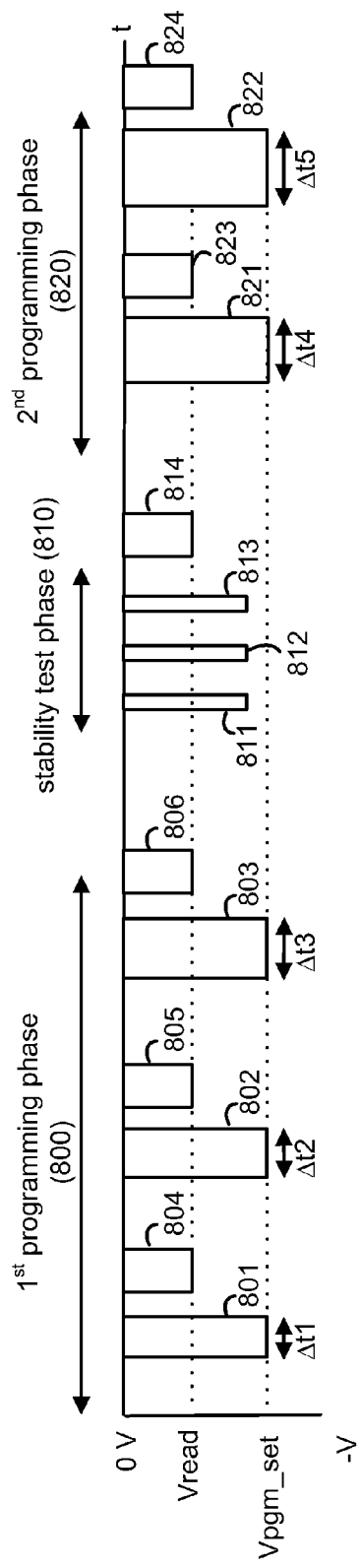

# US 8,861,258 B2

SET/RESET ALGORITHM WHICH DETECTS AND REPAIRS WEAK CELLS IN RESISTIVE-SWITCHING MEMORY DEVICE

BACKGROUND

The present technology relates to data storage.

A variety of materials show resistance-change or resistance-switching behavior in which the resistance of the material is a function of the history of the current through, and/or voltage across, the material. These materials include chalcogenides, carbon polymers, perovskites, and certain metal oxides (MeOx) and metal nitrides (MeN). Specifically, there are metal oxides and nitrides which include only one metal and exhibit reliable resistance switching behavior. This group includes, for example, Nickel Oxide (NiO), Niobium Oxide (Nb2O5), Titanium Dioxide (TiO2), Hafnium Oxide (HfO2) Aluminum Oxide (Al2O3), Magnesium Oxide (MgOx), Chromium Dioxide (CrO2), Vanadium Oxide (VO), Boron Nitride (BN), and Aluminum Nitride (AlN). The material may be formed in an initial state, for example, a relatively low-resistance state. Upon application of sufficient voltage, the material switches to a stable high-resistance state which is maintained after the voltage is removed. In some cases, the resistance switching is reversible such that subsequent application of an appropriate current or voltage can serve to return the material to a stable low-resistance state which is maintained after the voltage or current is removed. This conversion can be repeated many times. For some materials, the initial state is high-resistance rather than low-resistance. A set process may refer to switching the material from high to low resistance, while a reset process may refer to switching the material from low to high resistance. The set and reset processes can be considered to be programming processes which change the resistance state. In other cases, the resistance switching is irreversible.

Resistance-change materials are of interest for use in non-volatile memory arrays. One resistance state may correspond to a data "0," for example, while the other resistance state corresponds to a data "1." Some of these materials may have more than two stable resistance states. Moreover, in a memory cell, the material can be in series with a steering element such as a diode, which selectively limits the voltage across, and/or the current flow through, the material. For example, a diode can allow current to flow in only one direction of the while essentially preventing a current flow in the opposite direction. Such a steering element itself is not typically a resistance-change material. Instead, the steering element allows a memory cell to be written to, and/or read from, without affecting the state of other memory cells in an array.

BRIEF DESCRIPTION OF THE DRAWINGS

FIG. 4A is a graph depicting I-V characteristics of an example bipolar resistance-switching material which sets using a positive voltage.

FIG. 4C1 depicts a portion of the I-V plots of FIG. 4A or 4B showing the use of a verify voltage of a stability verify test (Vver_stability) which is less than a verify voltage (Vread) of a program verify test, to make the stability verify test more strict than the program verify test in a set process.

FIG. 4C2 depicts a portion of the I-V plots of FIG. 4A or 4B showing the use of a verify voltage of a stability verify test (Vver_stability) which is more than a verify voltage (Vread) of a program verify test, to make the stability verify test less strict than the program verify test in a set process.

FIG. 4D depicts a portion of the I-V plots of FIG. 4A or 4B showing the use of a verify current of a stability verify test (Iverify_set+ΔI) which is more than a verify current of a program verify test (Iverify_set), to make the stability verify test more strict than the program verify test in a set process, or the use of a verify current of a stability verify test (Iverify_set−ΔI) which is less than a verify current of a program verify test (Iverify_set), to make the stability verify test less strict than the program verify test in a set process.

FIG. 4E1 depicts a portion of the I-V plots of FIG. 4A or 4B showing the use of a verify voltage of a stability verify test (Vver_stability) which is more than a verify voltage (Vread) of a program verify test, to make the stability verify test more strict than the program verify test in a reset process.

FIG. 4E2 depicts a portion of the I-V plots of FIG. 4A or 4B showing the use of a verify voltage of a stability verify test (Vver_stability) which is less than a verify voltage (Vread) of a program verify test, to make the stability verify test less strict than the program verify test in a reset process.

FIG. 4F depicts a portion of the I-V plots of FIG. 4A or 4B showing the use of a verify current of a stability verify test (Iverify_reset−ΔI) which is less than a verify current of a program verify test (Iverify_reset), to make the stability verify test more strict than the program verify test in a reset process, or the use of a verify current of a stability verify test (Iverify_reset+ΔI) which is more than a verify current of a program verify test (Iverify_set), to make the stability verify test less strict than the program verify test in a reset process.

FIG. 5 depicts an embodiment of a circuit for reading the state of a memory cell.

FIG. 6A depicts an example process for changing the resistance state of a memory cell.

FIG. 6B depicts example details of a first programming phase in accordance with step 601 of FIG. 6A.

FIG. 6C depicts example details of a stability test phase in accordance with step 602 of FIG. 6A.

FIG. 6F depicts a comparative set operation which is concluded after a program verify test is passed.

FIG. 6G depicts a comparative reset operation which is concluded after a program verify test is passed.

FIG. 6H depicts a relaxation of resistance-switching memory cells from the set or reset state over a time period such as one minute.

FIG. 7 depicts example voltages used in a set process, where a magnitude of the program voltages increases in first and second programming phases, two disturb voltages have a same polarity as the program voltages and a read operation is performed after each of the two disturb voltages.

FIG. 8 depicts example voltages used in a set process, where a magnitude of the program voltages increases in first and second programming phases, three disturb voltages have a same polarity as the program voltages and a read operation is performed after the three disturb voltages.

DETAILED DESCRIPTION

Figure 1:
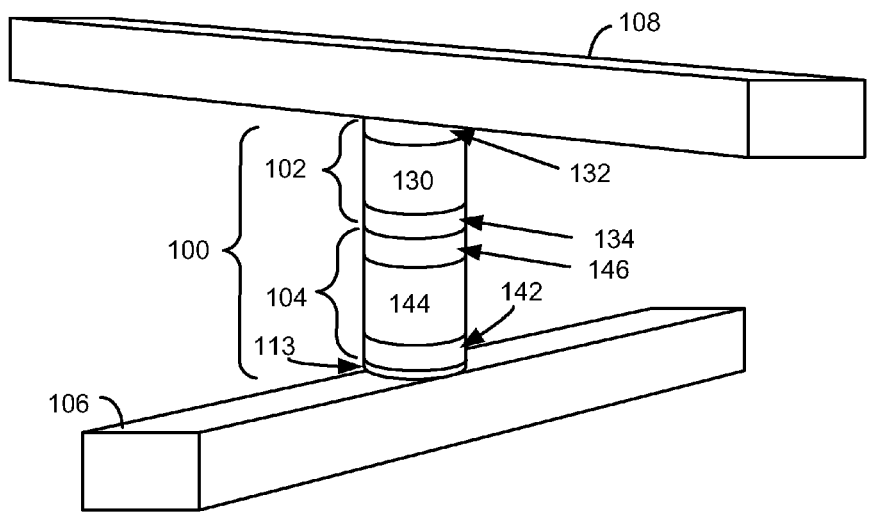
FIG. 1 is a simplified perspective view of one embodiment of a memory cell which includes a resistance-switching material in series with a steering element.

A programming technique is provided for improving the stability of a resistance-switching memory device. The technique detects and fixes weak memory cells which are likely to relax from their programmed state. Moreover, these weak memory cells can be detected and fixed quickly without degrading other memory cells which are stable in a programmed state.

To allow memory devices to be scaled to smaller dimensions, operating currents are reduced. However, this can degrade the stability of a high or low resistance state in a resistance-switching memory cell. For example, resistance-switching materials such as metal oxides which are operated at a low current such as less than 20 μA can experience an unstable resistance state. That is, the resistance state which is reached after a set/reset operation at low current may change back toward its original state in a short time in a process referred to as "cell relaxation." This is a significant reliability issue. In contrast, when a memory cell is set/reset at a higher power (with a correspondingly higher current, e.g., >40 uA) a more stable state can be achieved. In this case, the memory cell is operated at lower resistance state, e.g., having an on resistance of R_on <100 KOhm. However, as mentioned, the higher operating current limits the ability to scale the memory device to smaller dimensions. Also, high current limits the number of bits to be programmed at the same time, resulting in a low speed product. Similarly, a longer set/reset time (e.g., a program voltage duration in the millisecond range) can be used to obtain a more stable state. However, this long duration reduces device performance in terms of speed.

Programming techniques provided herein address these challenges. In one approach, in a set or reset process, a memory cell is programmed in a first programming phase until a program verify test is passed. A stability test phase then tests the stability of the memory cell, e.g., the likelihood that the memory cell will relax by transitioning out of the programmed state. In one implementation, the stability test phase applies one or more voltages which are less intense than the voltages applied during the first programming phase to perturb the memory cell without programming it further. For example, the stability test phase can apply disturb voltages have a reduced duration and/or magnitude compared with regular program voltages of a set/reset operation.

The stability test phase can apply a stability verify test after the one or more voltages to assess how the memory cell has responded to the perturbations. The stability verify test can be the same or different than the program verify test. If the result of the stability test phase indicates that the memory cell has relaxed out of the programmed state, a second programming phase is performed in which one or more additional program voltages are applied. These voltages can be applied with a characteristic such as amplitude, duration or current limit which is based on a value of the characteristic at a conclusion of the first programming phase. If the result of the stability test phase indicates that the memory cell has not relaxed out of the programmed state, the programming operation can be concluded without the second programming phase. A memory cell which has a stable state can sustain the disturb voltages. Thus, a set or reset is considered to be completed when the memory cell passes one or more stability verify tests after reaching a target verify level in a first programming phase.

A number of variations exist regarding the disturb voltages. For example, the polarity of all of the disturb voltages can be the same as the polarity of the program voltages. Or, the polarity of all of the disturb voltages can be opposite to the polarity of the program voltages. In another approach, both opposite and same polarity voltages are used. As an example, one to five disturb voltages can be used. In some implementations, the voltage amplitude is 20% to 100% of the amplitude of the program voltages.

FIG. 1 is a simplified perspective view of one embodiment of a memory cell which includes a resistance-switching material in series with a steering element. The memory cell 100 is between a first conductor 106 and a second conductor 108 and includes a top electrode 132, a resistance-switching material 130 and a bottom electrode 134. The memory cell also includes a steering element 104 such as a diode comprising a heavily doped n+ polysilicon region 142, a lightly doped or an intrinsic (unintentionally doped) polysilicon region 144 above the n+ polysilicon region 142 and a heavily doped p+ polysilicon region 146 above the intrinsic region 144. An optional adhesion or barrier layer 113 may be included on top of the conductor 106.

As mentioned, a resistance-switching material has a resistivity that may be reversibly switched between two or more states. For example, the material may be in an initial high-resistivity (high resistance) state upon fabrication that is switchable to a low-resistivity state upon application of a first voltage and/or current. Application of a second voltage and/or current may return the material to the high-resistivity state. Alternatively, the material may be in an initial low-resistance state upon fabrication that is reversibly switchable to a high-resistance state upon application of the appropriate voltage(s) and/or current(s). When used in a memory cell, one resistance state for the material may represent a binary "0" while another resistance state may represent a binary "1." In some case, more than two data/resistance states may be used.

In one embodiment, the process of switching the resistance-switching material from the high-resistivity state (representing, e.g., binary data "0") to the low-resistivity state (representing, e.g., binary data "1") is referred to as setting or forming, and the process of switching the resistance-switching material from the low-resistivity state to the high-resistivity state is referred to as resetting. In other embodiments, setting and resetting and/or the data encoding can be reversed. The set or reset process can be performed for a memory cell to program it to a desired state to represent binary data.

The conductors 106 and 108 may be control lines such as a bit line or a word line. In one embodiment, the top electrode 132 is made of titanium (Ti) or titanium nitride (TiN). The bottom electrode may be made of Titanium Nitride (TiN), and serves as an adhesion and barrier layer.

The steering element 104 can be a diode, as mentioned, or other suitable steering element that exhibits non-ohmic conduction by selectively limiting the voltage across and/or the current flow through the resistance-switching material. In one approach, the steering element allows current to flow through the resistance-switching material in only one direction, e.g., from the bit line to the word line. In another approach, a steering element such as a punch-through diode allows current to flow through the resistance-switching material in either direction depending on the polarity and voltage applied.

In this manner, the memory cell may be used as part of a two- or three-dimensional memory array and data may be written to and/or read from the memory cell without affecting the state of other memory cells in the array.

The steering element and the resistance-switching material together can be in the shape of a vertical pillar.

Conductors 106 and 108 include any suitable conductive material such as tungsten, any appropriate metal, heavily doped semiconductor material, a conductive silicide, a conductive silicide-germanide, a conductive germanide, or the like. In the embodiment shown, the conductors 106 and 108 are rail-shaped and extend in different directions (e.g., substantially perpendicular to one another). Other conductor shapes and/or configurations may be used. In some embodiments, barrier layers, adhesion layers, antireflection coatings and/or the like (not shown) may be used with conductors 106 and 108 to improve device performance and/or aid in device fabrication. The conductors 106 may be a word line while the conductor 108 is a bit line, or vice-versa.

In an example implementation, the top electrode 132 and the bottom electrode 134 are a conductive material such as n+Si, while the resistance-switching materials 130 is HfOx.

While the resistance-switching material 130 is shown as being positioned above the steering element 104, in alternative embodiments, the resistance-switching material may be positioned below the steering element 104. Various other configurations are possible as well. A resistance-switching material can exhibit unipolar or bipolar resistance-switching characteristics. With a unipolar resistance-switching characteristic, the voltages used for both set and reset processes are of the same polarity, i.e., either both positive or both negative. In contrast, with a bipolar resistance-switching characteristic, opposite polarity voltages are used for the set and reset processes. Specifically, the voltage used for the set process can be positive while the voltage used for the reset process is negative, or the voltage used for the set process can be negative while the voltage used for the reset process is positive.

Figure 2A:
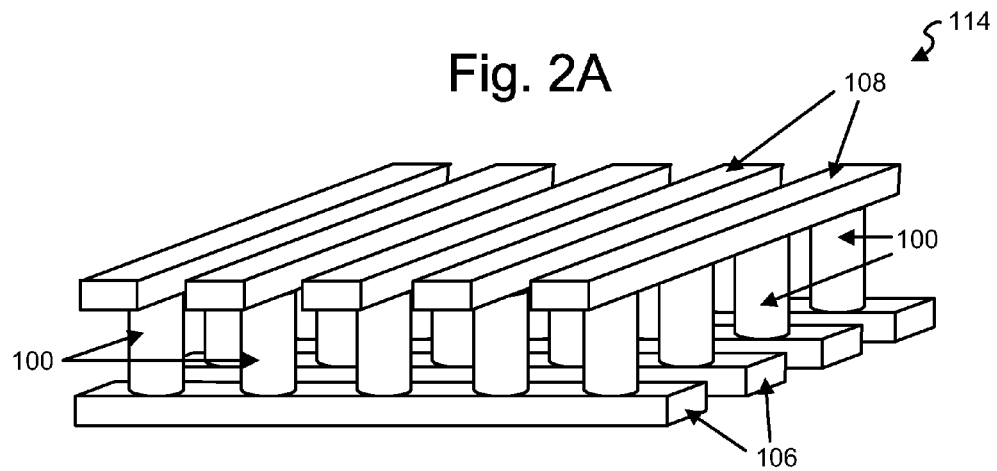
FIG. 2A is a simplified perspective view of a portion of a first memory level formed from a plurality of the memory cells of FIG. 1.

FIG. 2A is a simplified perspective view of a portion of a first memory level 114 formed from a plurality of the memory cells 100 of FIG. 1. For simplicity, the resistance-switching material and the steering element are not separately shown. The memory array 114 is a "cross-point" array including a plurality of bit lines (second conductors 108) and word lines (first conductors 106) to which multiple memory cells are coupled as shown. Other memory array configurations may be used, as may multiple levels of memory.

Figure 2B:
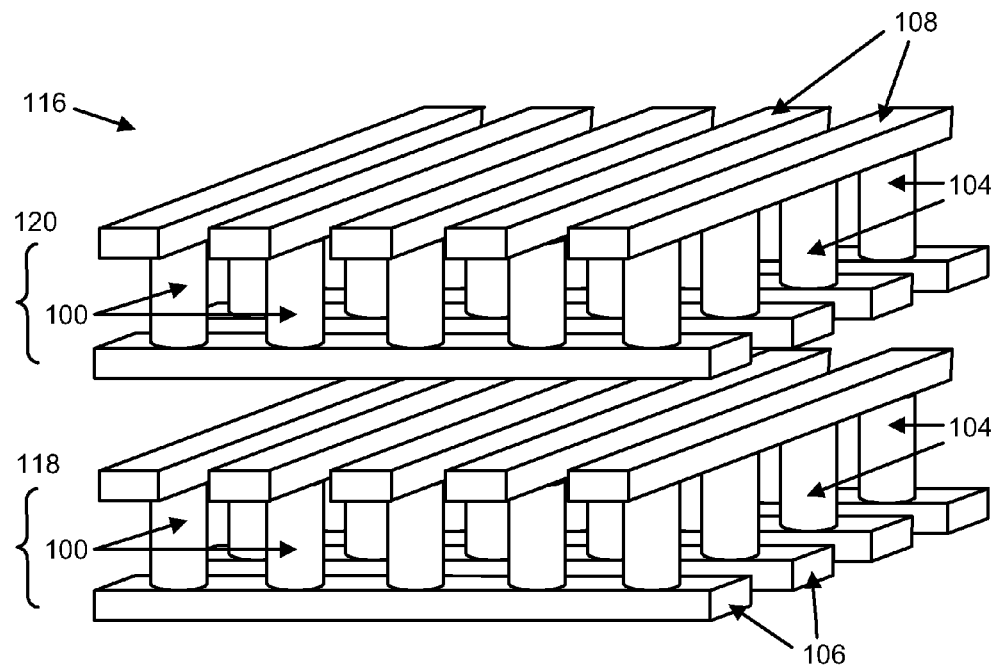
FIG. 2B is a simplified perspective view of a portion of a three-dimensional memory array formed from a plurality of the memory cells of FIG. 1.

FIG. 2B is a simplified perspective view of a portion of a monolithic three-dimensional array 116 that includes a first memory level 118 positioned below a second memory level 120. Each memory level includes a plurality of memory cells 100 in a cross-point array. Additional layers (e.g., an inter-level dielectric) may be present between the first and second memory levels but are not shown for simplicity. Other memory array configurations may be used, as may additional levels of memory. In the embodiment of FIG. 2B, all diodes may "point" in the same direction, such as upward or downward depending on whether p-i-n diodes having a p-doped region on the bottom or top of the diode are employed, simplifying diode fabrication.

Figure 2C:
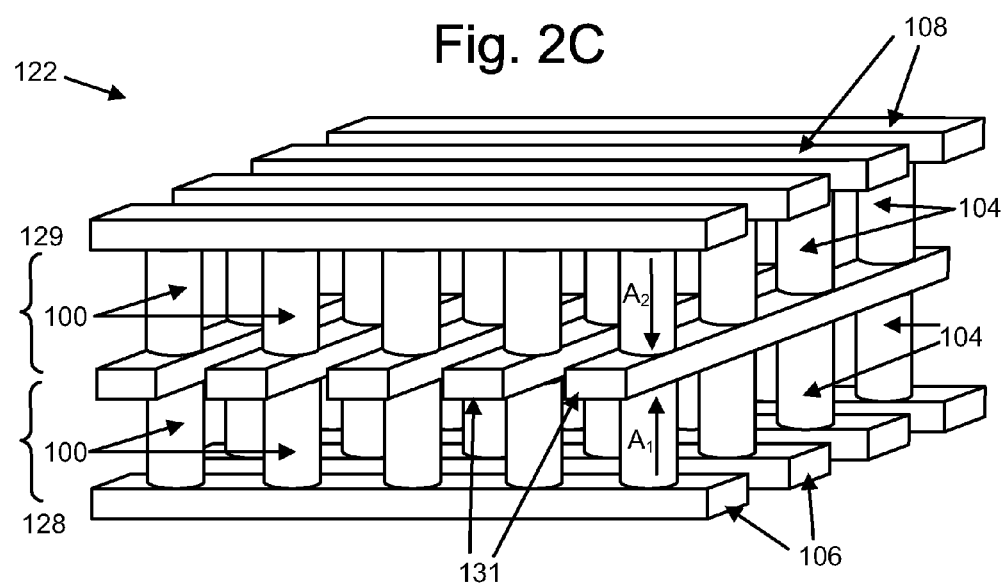
FIG. 2C is a simplified perspective view of a portion of a monolithic three-dimensional array 122 that includes a first memory level 128 positioned below a second memory level 129, where the upper conductors 131 of the first memory level are used as the lower conductors of the second memory level.

FIG. 2C is a simplified perspective view of a portion of a monolithic three-dimensional array 122 that includes a first memory level 128 positioned below a second memory level 129, where the upper conductors 131 of the first memory level are used as the lower conductors of the second memory level. In such embodiments, the diodes on adjacent memory levels can point in opposite directions. For example, the diodes of the first memory level may be upward pointing diodes as indicated by arrow A1 (e.g., with p regions at the bottom of the diodes), while the diodes of the second memory level may be downward pointing diodes as indicated by arrow A2 (e.g., with n regions at the bottom of the diodes), or vice versa.

A monolithic three-dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other.

The above examples show memory cells in a cylindrical or pillar shape and conductors in the shapes of rails according to the disclosed arrangements. However, the technology described herein is not limited to any one specific structure for a memory cell. Other structures can also be used to form memory cells that include resistance-switching materials. Another example memory configuration is a vertical bit line cross point memory array such as described in U.S. pat. app. pub. 2012/0147648, published Jun. 14, 2012 and titled "Three Dimensional Non-Volatile Storage With Dual Gate Selection Of Vertical Bit Lines."

Figure 3:
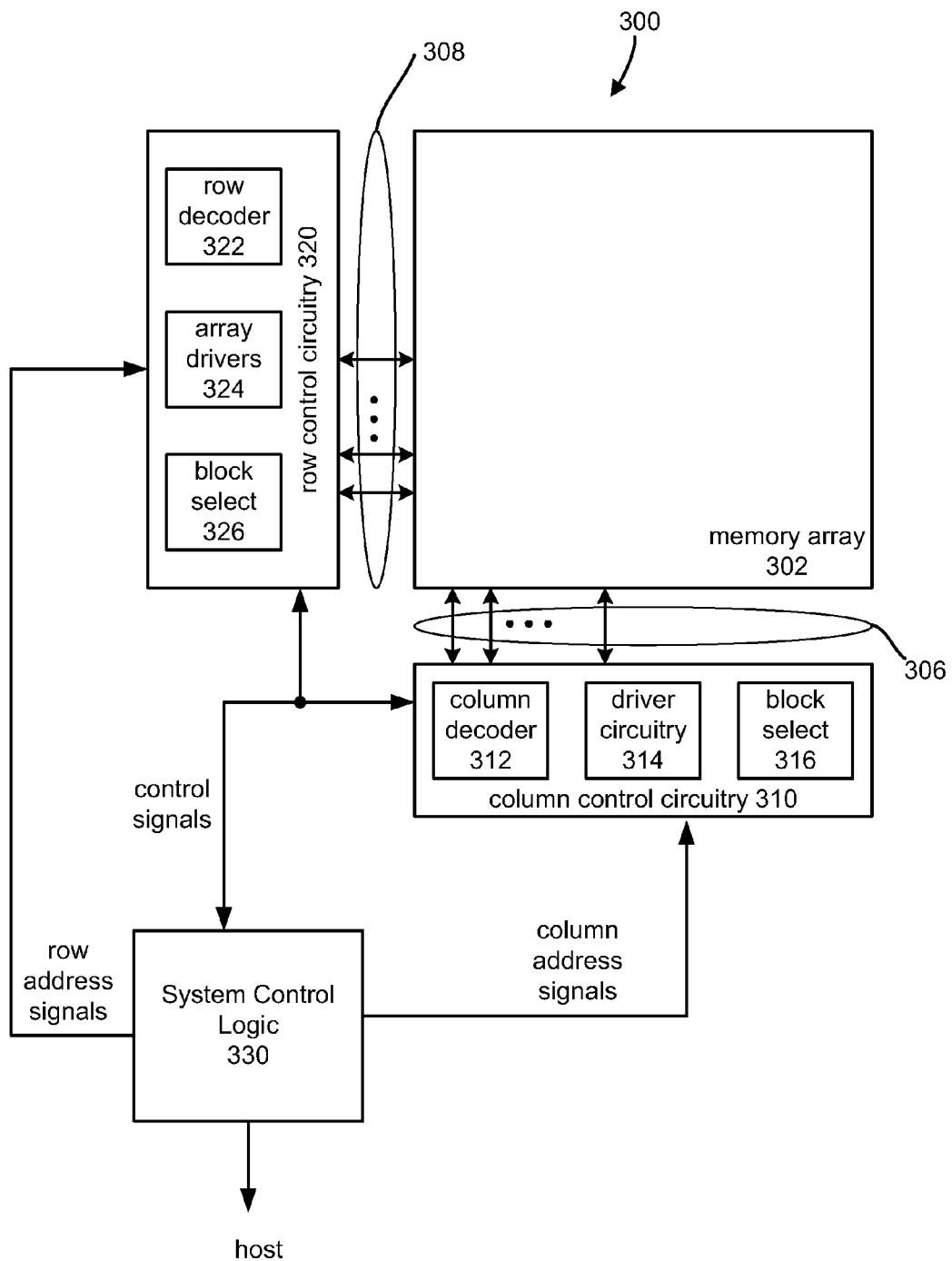
FIG. 3 is a block diagram of one embodiment of a memory system.

FIG. 3 is a block diagram that depicts one example of a memory system 300 that can implement the technology described herein. Memory system 300 includes a memory array 302 that can be a two- or three-dimensional array of memory cells as described above. In one embodiment, memory array 302 is a monolithic three-dimensional memory array. The array terminal lines of memory array 302 include the various layer(s) of word lines organized as rows, and the various layer(s) of bit lines organized as columns. However, other orientations can also be implemented.

Memory system 300 includes row control circuitry 320, whose outputs 308 are connected to respective word lines of the memory array 302. Row control circuitry 320 receives a group of M row address signals and one or more various control signals from system control logic circuit 330, and typically may include such circuits as row decoders 322, array terminal drivers 324, and block select circuitry 326 for both read and programming (e.g., set and reset) operations. Memory system 300 also includes column control circuitry 310 whose input/outputs 306 are connected to respective bit lines of the memory array 302. Column control circuitry 310 receives a group of N column address signals and one or more various control signals from system control logic 330, and typically may include such circuits as column decoders 312, array terminal receivers or drivers 314, block select circuitry 316, as well as read/write circuitry, including sense amps and I/O multiplexers. System control logic 330 receives data and commands from a host and provides output data to the host. In other embodiments, system control logic 330 receives data and commands from a separate controller circuit and provides output data to that controller circuit, with the controller circuit communicating with the host. System control logic 330 may include one or more state machines, registers and other control logic for controlling the operation of memory system 300. For example, write circuitry 560, sense amplifier 566 and clamp control circuitry 564, discussed further below in FIG. 5, may be provided.

In one embodiment, all of the components depicted in FIG. 3 are arranged on a single integrated circuit or chip. For example, system control logic 330, column control circuitry 310 and row control circuitry 320 can be formed on the surface of a substrate and memory array 302 in a monolithic three-dimensional memory array formed above the substrate (and, therefore, above system control logic 330, column control circuitry 310 and row control circuitry 320). In some cases, a portion of the control circuitry can be formed on the same layers as some of the memory array.

Integrated circuits incorporating a memory array usually subdivide the array into a number of sub-arrays or blocks. Blocks can be further grouped together into bays that contain, for example, 16, 32, or a different number of blocks. As frequently used, a sub-array is a contiguous group of memory cells having contiguous word and bit lines generally unbroken by decoders, drivers, sense amplifiers, and input/output circuits. This is done for any of a variety of reasons. For example, the signal delays traversing down word lines and bit lines which arise from the resistance and the capacitance of such lines (i.e., the RC delays) may be very significant in a large array. These RC delays may be reduced by subdividing a larger array into a group of smaller sub-arrays so that the length of each word line and/or each bit line is reduced. As another example, the power associated with accessing a group of memory cells may dictate an upper limit to the number of memory cells which may be accessed simultaneously during a given memory cycle. Consequently, a large memory array is frequently subdivided into smaller sub-arrays to decrease the number of memory cells which are simultaneously accessed. Nonetheless, for ease of description, an array may also be used synonymously with sub-array to refer to a contiguous group of memory cells having contiguous word and bit lines generally unbroken by decoders, drivers, sense amplifiers, and input/output circuits. An integrated circuit may include one or more than one memory array.

As described above, resistance-switching material may be reversibly switched between two or more states. For example, the resistance-switching material may be in an initial, high-resistivity state upon fabrication that is switchable to a low-resistivity state upon application of a first voltage and/or current. Application of a second voltage and/or current may return the resistance-switching material to a high-resistivity state. The memory system 300 can used with any type of resistance-switching material.

FIG. 4A is a graph depicting I-V characteristics of an example bipolar resistance-switching material which sets using a positive voltage. In this example, the set process (a transition from Rhigh to Rlow) occurs when a positive voltage is applied, and the reset process (a transition from Rlow to Rhigh) occurs when a negative voltage is applied. Line 402 represents the I-V characteristic when in the high-resistivity (Rhigh) state and line 400 represents a transition to the low-resistivity (Rlow) state. Line 401 represents the set process and line 403 represents the reset process.

A read voltage Vread is also depicted. To determine the resistance-switching material's state, Vread is applied across the resistance-switching material while the resulting current is measured and compared to a reference or trip current Iread. A higher or lower measured current indicates that the resistance-switching material is in the low- or high-resistivity state, respectively. For example, if Ioff<Iread is measured, the material is in the high resistance state. If Ion>Iread is measured, the material is in the low resistance state. A forming voltage Vf is also depicted. This is an example of a user read which occurs after the memory cell has been programmed. In this case, the reference current is positioned to provide a roughly equal margin between the expected current in the Rlow state, Ion and the expected current in the Rhigh state, Ioff. Vread can also be used during a program verify process in which case the reference current can be different than during a user read. For example, a set verify current (Iverify_set) can be greater than Iread to provide a margin above Iread. Similarly, a reset verify current (Iverify_reset) can be less than Iread to provide a margin below Iread. Vread can be the same or different during a user read or a program verify read.

Specifically, due to sensing noise, temperature differences, supply voltage variation, cell relaxation variations and other factors, a given cell may not flow the exact same current when read at different times, e.g., verify versus user read. To ensure a valid user read with high probability, the on chip circuitry can provide a margin between the verify read and the user read. The margin can be in the direction to make it more difficult to pass a verify read than a user read. For example, if the cell is in a high current state (low resistance state) the verify read can be at a lower Vread, e.g., 50 mV lower, or with a higher reference current as compared to user read conditions. For a cell in a low current state (high resistance state) the verify read can be at a slightly higher Vread or a lower reference current compared to user read conditions. See FIGS. 4C1 to 4F for examples of how changing the reference current or the applied voltage affects the sensing process.

Further, a stability verify test as discussed further below can use Vread or another voltage level. A stability verify test can have the same or different strictness compared to a program verify test. One approach is to have a common reference current and read voltage for the stability verify test and the program verify test. Thus, there is a common trip level for both cases. Further, there could be margin between this common trip level for verify and the trip level for a user read. This approach results in a high probability of valid cell read. But, there is a higher probability of failing the stability verify test when noise or very small relaxations occur. This results in a performance penalty due to more frequency use of the second programming phase.

Another approach is for the stability verify test to be less strict than the program verify test. See FIG. 4C2, 4D, 4E2 and 4F. In this case, there is a margin between the program verify test and the stability verify test such that it is easier to pass the stability verify test. This approach reduces the probability of failing the stability verify test, thereby also reducing the frequency with which the second programming phase is used.

Yet another approach is for the stability verify test to be more strict than the program verify test. See FIG. 4C1, 4D, 4E1 and 4F. This approach increases the probability of failing the stability verify test, thereby also increasing the frequency with which the second programming phase is used. However, this approach ensures that the cells are well programmed so that the likelihood of relaxation is reduced.

A current limit Iset_limit for a current through the memory cell can be enforced during a set process.

During a set process, the program voltage Vpgm_set can have a range of magnitudes as indicated by arrow 405. The magnitude may be less than Vset and then step up. Similarly, during a reset process, the program voltage Vpgm_reset can have a range of magnitudes as indicated by arrow 404. The magnitude may be less than Vreset and then step up. Ireset is a current in the cell when it resets. Due to variations among cells, they will set or reset under slightly different conditions. The use of step-wise increasing voltages allows each cell to set or reset using the lowest possible voltage.

Figure 4B:
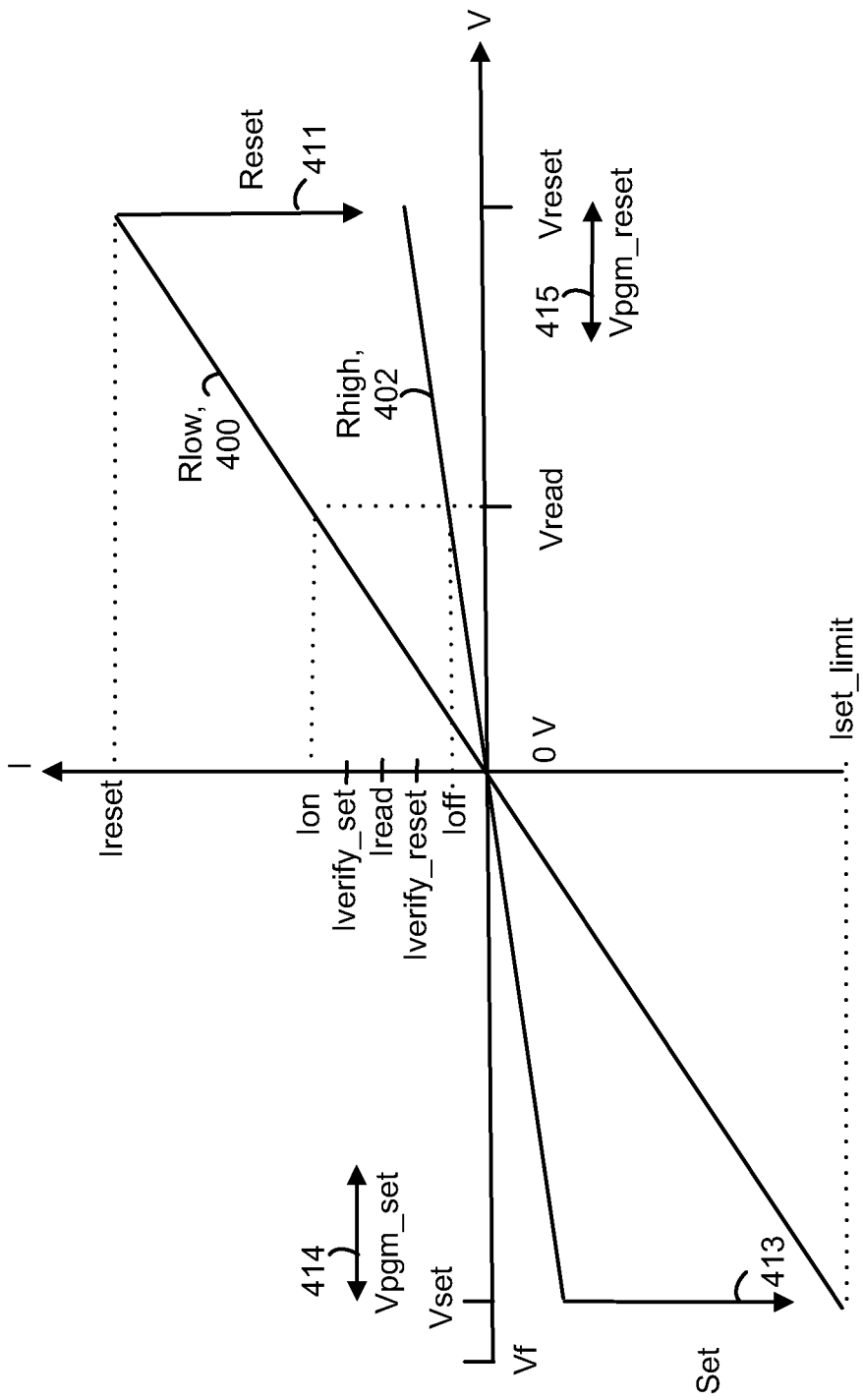
FIG. 4B is a graph depicting I-V characteristics of an example bipolar resistance-switching material which sets using a negative voltage.

FIG. 4B is a graph depicting I-V characteristics of an example bipolar resistance-switching material which sets using a negative voltage. Line 400 represents the Rlow state and line 402 represents the Rhigh state as in FIG. 4A. Line 411 represents a reset and line 413 represents a set. Arrow 414 represents a range of magnitudes for Vpgm_set and arrow 415 represents a range of magnitudes for Vpgm_reset.

FIG. 4C1 depicts a portion of the I-V plots of FIG. 4A or 4B showing the use of a verify voltage of a stability verify test (Vver_stability) which is less than a verify voltage (Vread) of a program verify test, to make the stability verify test more strict than the program verify test in a set process. A verify test for a set process can be made more strict (harder to pass) by lowering the read voltage while fixing the reference current (Iverify_set). The figure indicates that a group of memory cells can vary in their I-V characteristic. Line 420 represents an upper bound of the group and line 421 represents a lower bound. Arrow 422 denotes a range of current values for the group when Vread is applied. The current values are all higher than Iverify_set so that a verify test using Vread would pass for all of the cells in the group. Arrow 423 denotes a range of current values for the group when Vver_stability is applied. Some of the current values are lower than Iverify_set so that a verify test using Vver_stability would pass for some but not all of the cells in the group.

The graphs are not necessarily to scale.

FIG. 4C2 depicts a portion of the I-V plots of FIG. 4A or 4B showing the use of a verify voltage of a stability verify test (Vver_stability) which is more than a verify voltage (Vread) of a program verify test, to make the stability verify test less strict than the program verify test in a set process. Arrow 450 denotes a range of current values for the group when Vver_stability is applied. All of the current values are above Iverify_set so that a verify test using Vver_stability would pass for all of the cells in the group.

FIG. 4D depicts a portion of the I-V plots of FIG. 4A or 4B showing the use of a verify current of a stability verify test (Iverify_set+$\Delta$I) which is more than a verify current of a program verify test (Iverify_set), to make the stability verify test more strict than the program verify test in a set process, or the use of a verify current of a stability verify test (Iverify_set−$\Delta$I) which is less than a verify current of a program verify test (Iverify_set), to make the stability verify test less strict than the program verify test in a set process.

A verify test for a set process can be made more strict by raising the reference current while fixing the read voltage. Arrow 424 denotes a range of current values for the set when Vread is applied. The current values are all higher than Iverify_set so that a verify test using Iverify_set would pass for all of the cells in the group. However, the current values are not all higher than Iverify_set+$\Delta$I so that a verify test using Iverify_set+$\Delta$I would pass for some but not all of the cells in the group.

Similarly, a verify test for a set process can be made less strict by lowering the reference current while fixing the read voltage. The current values are all higher than Iverify_set−$\Delta$I so that a verify test using Iverify_set−$\Delta$I would pass for all of the cells in the group.

FIG. 4E1 depicts a portion of the I-V plots of FIG. 4A or 4B showing the use of a verify voltage of a stability verify test (Vver_stability) which is more than a verify voltage (Vread) of a program verify test, to make the stability verify test more strict than the program verify test in a reset process. A verify test for a reset process can be made more strict by raising the read voltage while fixing the reference current (Iverify_set). Line 430 represents an upper bound of the group and line 431 represents a lower bound. Arrow 433 denotes a range of current values for the group when Vread is applied. The current values are all lower than Iverify_set so that a verify test using Vread would pass for all of the cells in the group. Arrow 432 denotes a range of current values for the group when Vver_stability is applied. Some of the current values are greater than Iverify_set so that a verify test using Vver_stability would pass for some but not all of the cells in the group.

FIG. 4E2 depicts a portion of the I-V plots of FIG. 4A or 4B showing the use of a verify voltage of a stability verify test (Vver_stability) which is less than a verify voltage (Vread) of a program verify test, to make the stability verify test less strict than the program verify test in a reset process. Arrow 460 denotes a range of current values for the group when Vver_stability is applied. All of the current values are less than Iverify_set so that a verify test using Vver_stability would pass for all of the cells in the group.

FIG. 4F depicts a portion of the I-V plots of FIG. 4A or 4B showing the use of a verify current of a stability verify test (Iverify_reset−$\Delta$I) which is less than a verify current of a program verify test (Iverify_reset), to make the stability verify test more strict than the program verify test in a reset process, or the use of a verify current of a stability verify test (Iverify_reset+$\Delta$I) which is more than a verify current of a program verify test (Iverify_reset), to make the stability verify test less strict than the program verify test in a reset process. A verify test for a reset process can be made more strict by lowering the reference current while fixing the read voltage. Arrow 434 denotes a range of current values for the set when Vread is applied. The current values are all lower than Iverify_reset so that a verify test using Iverify_reset would pass for all of the cells in the group. However, the current values are not all lower than Iverify_set−$\Delta$I so that a verify test using Iverify_reset−$\Delta$I would pass for some but not all of the cells in the group.

Similarly, a verify test for a reset process can be made less strict by raising the reference current while fixing the read voltage. The current values are all lower than Iverify_set+$\Delta$I so that a verify test using Iverify_set+$\Delta$I would pass for all of the cells in the group.

FIG. 5 depicts an embodiment of a circuit for reading the state of a memory cell. A portion of a memory array includes memory cells 550, 552, 554 and 556. Two of the many bit lines and two of the many word lines are depicted. Bit line 559 is coupled to cells 550 and 554, and bit line 557 is coupled to cells 552 and 556. Bit line 559 is the selected bit line and may be at 2 V, for instance. Bit line 557 is an unselected bit line and may be at ground, for instance. Word line 547 is the selected word line and may be at 0 V, for instance. Word line 549 is an unselected word line and may be at 2 V, for instance.

A read circuit for one of the bit lines 559 is depicted to be connected to the bit line via transistor 558, which is controlled by a gate voltage supplied by column decoder 312 in order to select or unselect the corresponding bit line. Transistor 558 connects the bit line to a Data bus 563. Write circuit 560 (which is part of system control logic 330) is connected to the Data bus. Transistor 562 connects to the Data bus and operates as a clamp device that is controlled by clamp control circuit 564 (which is part of system control logic 330). Transistor 562 is also connected to a sense amp 566, which includes a data latch 568. The output of sense amp 566 is connected to a data out terminal (to system control logic 330, a controller and/or a host). Write circuit 560 is also connected to the sense amp 566 and the data latch 568.

When attempting to read the state of the resistance-switching material, all word lines are first biased at Vread (e.g., approximately 2 V) and all bit lines are at ground. The selected word line is then pulled to ground. For example, this discussion will assume that memory cell 550 is selected for reading. One or more selected bit lines 559 are pulled to Vread through the data bus (by turning on transistor 558) and the clamp device (transistor 562, which receives ~2 V+Vth, the threshold voltage of the transistor 562). The clamp device's gate is above Vread but controlled to keep the bit line near Vread. In one approach, current is pulled by the selected memory cell 550 through transistor 562 from a sense node in the sense amp. The sense node can receive a reference current that is between a high-resistivity state current and a low-resistivity state current. The sense node moves corresponding to the current difference between the cell current and the reference current. Sense amp 566 generates a data out signal by comparing the sensed voltage to a reference read voltage. If the memory cell current is larger than the reference current, the memory cell is in the low-resistivity state and the voltage at the sense node will be lower than the reference voltage. If the memory cell current is smaller than the reference current, the memory cell is in the high-resistivity state and the voltage at the sense node will be higher than the reference voltage. The output data signal from the sense amp 566 is latched in data latch 568.

Referring again to FIG. 4A, for example, while in the high-resistivity state (line 402), if one or more voltages of the program voltage and sufficient current are applied, the resistance-switching material can be set (line 401) to the low-resistivity state (line 400). The voltage will remain somewhat constant and the current will increase toward Iset_limit. Note that the first time the resistance-switching material is set, Vf (the forming voltage) is needed to set the device. After that, one or more voltages of Vpgm are sufficient to set the device. The forming voltage Vf may be greater than Vset. While in the low-resistivity state (line 400), if Vpgm<0 V is applied, the resistance-switching material can be reset to the high-resistivity state (line 402).

In one embodiment, Vset is approximately 7 V, Vreset is approximately −9 V, Iset_limit is approximately 1 to 10 μA and Ireset could be as low as, e.g., 100 nA. These voltages and currents apply to the case of a resistance-switching material and a diode in series.

FIG. 6A depicts an example process for changing the resistance state of a memory cell. As an overview, step 600 begins a programming operation (e.g., a set or reset). Step 601 performs a first programming phase. Step 602 performs a stability test phase. In response to the results from the stability test phase, one of two branches is followed. In one branch, step 603 performs a second programming phase. In another branch, step 604 ends the programming operation. This process addresses some of the challenges mentioned at the outset, including how to determine if a memory cell is in a stable state. As mentioned, with low current operation and shorter voltage durations, there is a relatively greater chance of the memory cell being in a less stable state. This process provides a practical way to find weak memory cells (e.g., memory cells which have an unstable state) and to repair them so that the state becomes more stable. Moreover, this can be done in a short amount of time and without degrading strong memory cells (e.g., memory cells which have a stable state).

Optionally, a loop back from step 603 to step 602 can be provided for a second stability test phase. This approach can provide an extra degree of assurance of stability before the end of the program operation. In addition, the loop between 602 and 603 could continue for one or more times until the stability test phase confirms a stable state. This approach provides additional programming if indicated to achieve the extra degree of assurance.

Another embodiment avoids a second stability test phase to save time but may result in fewer stable cells. However, this situation can be acceptable when ECC is used.

FIG. 6B depicts example details of a first programming phase in accordance with step 601 of FIG. 6A. Step 610 set initial values for parameters (e.g., voltage magnitude and/or duration and/or current limit) for the first programming phase. Step 612 applies a program voltage across a memory cell in accordance with the parameters. Step 613 performs a program verify test, e.g., a read operation in which Vread is applied and the current through the cell is compared to Iverify_set or Iverify_reset to determine whether the set or reset state, respectively, has been reached. Decision step 614 determines whether the program verify test has been passed. If the answer is "yes," the stability test phase begins at step 615. If the answer is "no," step 611 updates one or more values for the parameters, such as by increasing the voltage magnitude and/or duration and/or the current limit.

FIG. 6C depicts example details of a stability test phase in accordance with step 602 of FIG. 6A. Step 620 sets initial values for the parameters (e.g., voltage magnitude and/or duration and/or current limit) for the stability test phase. In one approach, the voltage is weaker than the voltages in the first programming phase, e.g., in terms of magnitude and/or duration and/or the current limit is lower. In another approach, the voltage is the same as one of voltage voltages in the first programming phase. Step 622 applies one or more disturb voltages across the memory cell in accordance with the parameters. Step 623 performs a stability verify test, e.g., a read operation in which Vver_stability is applied and the current through the cell is compared to Iverify_set or Iverify_reset to determine whether the set or reset state, respectively, has been reached. As discussed, Vver_stability can be the same as or different than Vread and Iverify_set or Iverify_reset can be the same as or different than the levels used during the programming phase.

Decision step 624 determines whether the stability verify test has been passed. If the answer is "yes," the programming operation ends at step 626. If the answer is "no," step 625 begins the second programming phase. In this example, one stability verify test is performed in the stability test phase.

Optionally, a loop back from step 625 to step 623 can be used to again perform the stability test to provide an extra degree of assurance of stability.

Figure 6D:
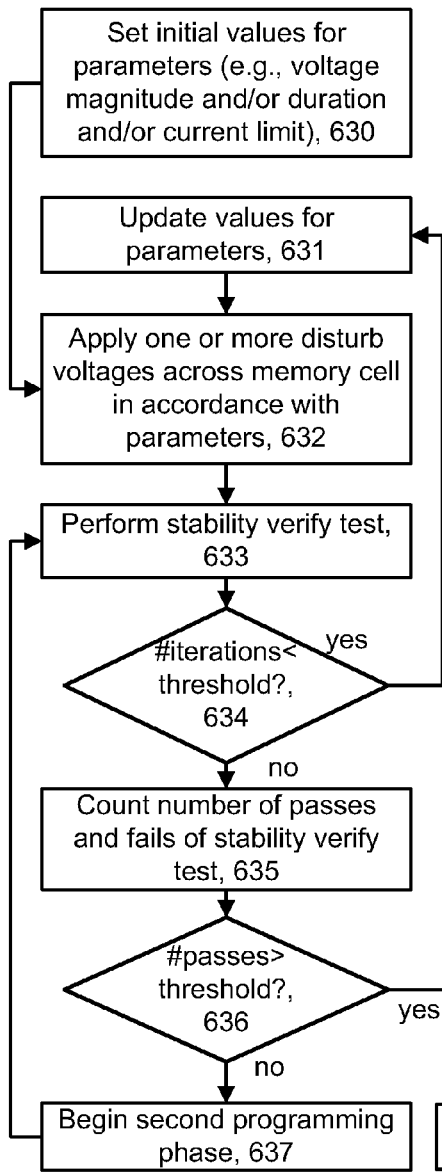
FIG. 6D depicts alternative example details of a stability test phase in accordance with step 602 of FIG. 6A.

FIG. 6D depicts alternative example details of a stability test phase in accordance with step 602 of FIG. 6A. Step 630 sets initial values for the parameters (e.g., voltage magnitude and/or duration and/or current limit) for the stability test phase. Step 632 applies one or more disturb voltages across a memory cell in accordance with the parameters. Step 633 performs a stability verify test as discussed previously. Decision step 634 determines whether a number of the stability iterations is less than a threshold number. If the answer is "yes," another iteration in the stability test phase is performed beginning at step 631 where one or more values for the parameters are optionally updated. If the answer is "no," step 635 counts a number of passes and fails of the stability verify test. Decision step 636 determines whether the number of passes is greater than a threshold number. If the answer is "yes," the programming operation ends at step 638. If the answer is "no," the second programming phase begins at step 637.

Optionally, a loop back from step 637 to step 633 can be used to again perform the stability verify test. This provides an extra degree of assurance of stability.

Figure 6E:
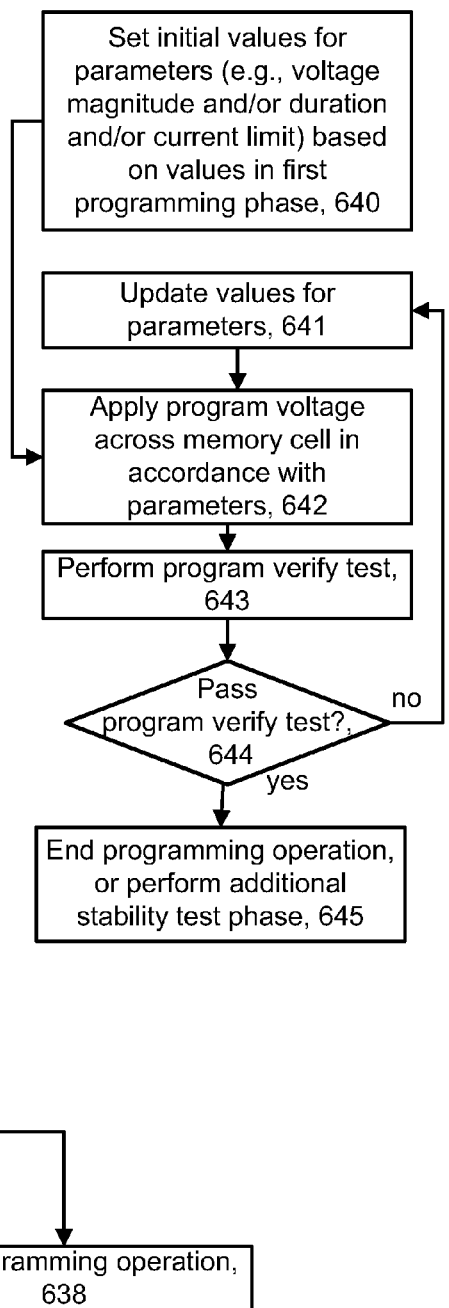
FIG. 6E depicts example details of a second programming phase in accordance with step 603 of FIG. 6A.

FIG. 6E depicts example details of a second programming phase in accordance with step 603 of FIG. 6A. Step 640 sets initial values for the parameters (e.g., voltage magnitude and/or duration and/or current limit) for the second programming phase based on values in the first programming phase. Step 642 applies a program voltage across a memory cell in accordance with the parameters. Step 643 performs a program verify test. Decision step 644 determines whether the program verify test is passed. If the answer is "yes," the programming operation ends at step 645. Optionally, an additional stability test phase can be performed to provide an extra degree of stability.

If the answer is "no," one or more values of the parameters are updated at step 641 and a next iteration is performed.

In one approach, the second programming phase represents a continuation of the first programming phase. For example, if the magnitude of the program voltage is Vpgm3_set (see FIG. 7) in the last iteration of the first programming phase, the magnitude of the program voltage can be Vpgm4_set (see FIG. 7) in the first iteration of the second programming phase. In this pattern, the magnitude of the program voltage is increased by a step size each time the program voltage is applied in the first programming phase, the initial voltage in the second programming phase is increased by the step size compared to the last voltage in the first programming phase, and the subsequent voltage voltages in the second programming phase are increased by the step size. However, other options are possible. In one option, the second programming phase uses a different step size than the first programming phase. In another option, the initial voltage in the second programming phase has a same magnitude compared to the last voltage in the first programming phase.

In another approach, the program voltage duration is increased instead of the magnitude (see FIG. 8). If the duration of the program voltage is Δt3 in the last iteration of the first programming phase, the duration of the program voltage can be Δt4 in the first iteration of the second programming phase. In this pattern, the duration of the program voltage is increased by a time step each time the program voltage is applied in the first programming phase, the duration of the initial voltage in the second programming phase is increased by the time step compared to the last voltage in the first programming phase, and the durations of the subsequent voltages in the second programming phase are increased by the time step. In one option, the second programming phase uses a different time step size than the first programming phase. In another option, the initial voltage in the second programming phase has a same duration compared to the last voltage in the first programming phase.

The current limit could also be incremented higher as the magnitude or duration of each program voltage is incremented. Generally, combinations of one or more of the program voltage magnitude, program voltage duration and the current limit can be incremented for each iteration in the first and second programming phases.

The first and second programming phases may be limited to a maximum number of iterations such that the programming operation ends in error if these phases end before the program verify test is passed.

Various examples of the above-mentioned processes are discussed next in connection with FIGS. 7 to 13.

FIG. 6F depicts a comparative set operation which is concluded after a program verify test is passed. This example is consistent with FIG. 4B, where negative voltages are applied in a set process. A program voltage 661 of magnitude Vpgm1_set is followed by a read voltage 664 of magnitude Vread. In this case, assume the program verify test is failed. Subsequently, a program voltage 662 of magnitude Vpgm2_set is followed by a read voltage 665 of magnitude Vread. In this case, assume the program verify test is again failed. Subsequently, a program voltage 663 of magnitude Vpgm3_set is followed by a read voltage 666 of magnitude Vread. In this case, assume the program verify test is passed and the set operation is completed. Essentially, once the set target is reached, the set operation is completed with no consideration for the stability of the resulting resistance state.

FIG. 6G depicts a comparative reset operation which is concluded after a program verify test is passed. A program voltage 671 of magnitude Vpgm1_reset is followed by a read voltage 674 of magnitude Vread. In this case, assume the program verify test is failed. Subsequently, a program voltage 672 of magnitude Vpgm2_reset is followed by a read voltage 675 of magnitude Vread. In this case, assume the program verify test is again failed. Subsequently, a program voltage 673 of magnitude Vpgm3_reset is followed by a read voltage 676 of magnitude Vread. In this case, assume the program verify test is passed and the reset operation is completed. Essentially, once the reset target is reached, the reset operation is completed.

The approach of FIGS. 6F and 6G uses a dual polarity algorithm in which one polarity is used for all voltages in the set process and the opposite polarity is used for all voltages in the reset process. Further, there is a read operation relative to a set or reset current. If the target is not met, the magnitude and/or duration of the voltage is increased and another program iteration is performed. However, as depicted in FIG. 6H, this approach can result in a significant portion of the memory cells relaxing away from the set or reset state.

FIG. 6H depicts a relaxation of resistance-switching memory cells from the set or reset state over a time period such as one minute. The x-axis depicts time such as on the scale of one minute and the y-axis depicts a read current through the memory cell for a given Vread.

Ion indicates a current of the memory cell when it is in a low resistance (on) state. An example current is 100 nA and an example resistance is 0.5 mega ohms with a read voltage of 2 V. For example, a set operation may be performed which causes a memory cell to transition from a high resistance state to the low resistance state. With the passage of time, the memory cells can relax back toward the high resistance state, such that the resistance increases as evidenced by the decrease in the current (since I=Vread/R). Plot 682 depicts the mean relaxation of a group of memory cells away from a high resistance state as a comparative example. Plot 680 depicts an improved mean relaxation of a group of memory cells away from a high resistance state using the techniques discussed herein.

Similarly, Ioff indicates a current of the memory cell when it is in a high resistance (off) state. An example current is 50 nA and an example resistance is 1-50 mega ohms with a read voltage of 2 V. For example, a reset operation may be performed which causes a memory cell to transition from a low resistance state to the high resistance state. With the passage of time, the memory cells can relax back toward the low resistance state, such that the resistance decreases as evidenced by the increase in the current. Plot 684 depicts the mean relaxation of a group of memory cells away from a low resistance state as a comparative example. Plot 686 depicts an improved mean relaxation of a group of memory cells away from a low resistance state using the techniques discussed herein.

FIG. 7 depicts example voltages used in a set process, where a magnitude of the program voltages increases in first and second programming phases, two disturb voltages have a same polarity as the program voltages and a read operation is performed after each of the two disturb voltages. This example is consistent with FIG. 4B, where negative voltages are applied in a set process. The programming operation includes a first programming phase 700, a stability test phase 710 and a second programming phase 720. In this example, the program voltage magnitude increases in steps. The first programming phase thus includes three program voltages, each followed by a read voltage. For example, a program voltage 701 of magnitude Vpgm1_set is followed by a read voltage 704, a program voltage 702 of magnitude Vpgm2_set is followed by a read voltage 705 and a program voltage 703 of magnitude Vpgm3_set is followed by a read voltage 706. A program verify test is performed when each read/verify voltage is applied. In this example, the program verify test is passed with the read voltage 706.

For simplicity, in FIGS. 7 to 13, Vread<0V so that it has the same polarity as the program pulses. However, Vread can be in the direction of a forward bias of a diode or other steering element, if present, in the cell to minimize the effect of the diode or steering element during the read process. Generally, set and/or reset pulses may be positive or negative relative to the forward bias direction of the cell and Vread may have a same or opposite polarity as the set and/or reset pulses.

A voltage can be applied, e.g., as a pulse having a fixed amplitude or as a waveform having a varying amplitude.

The stability test phase includes two example disturb voltages 711 and 712 followed by a read voltages 713 and 714, respectively, of the stability verify test. These disturb voltages have a similar magnitude as the program voltage 703 but are weaker because they are shorter in duration. Thus, these voltages will not have a strong programming effect on the memory cell. Instead, these voltages provide a disturbance which indicates whether the memory cell is weak and therefore has a tendency to relax back toward its pre-programmed state. As mentioned, the second programming phase may be omitted when the stability verify test is passed with the read voltage 713 or 714.

As an example, the second programming phase includes two program voltages, each followed by a read voltage. For example, a program voltage 721 of magnitude Vpgm4_set is followed by a read voltage 723, and a program voltage 722 of magnitude Vpgm5_set is followed by a read voltage 724. A program verify test is performed when each read/verify voltage is applied. In this example, the program verify test is passed with the read voltage 724 at which point the programming operation may end, or optionally a second stability test phase can be performed, as discussed previously.

In this example, during the stability test phase, the stability verify test is not performed until after two or more of the disturb voltages are applied. In any of the embodiments, a stability verify test may be performed after each of the disturb voltages are applied such as shown, e.g., in FIG. 9.

One approach sets an amplitude of an initial program voltage (Vpgm4_set) in the second programming phase based on an amplitude of a last program voltage (Vpgm3_set) in the first programming phase. The one or more program voltages in the second programming phase can have an increased magnitude and/or duration compared to the one or more program voltages in the first programming phase.

This approach uses program voltages having a polarity in the set direction where each program voltage is followed by a read/verify. If the cell reaches the target, then one or more short disturb voltages and one or more read voltages are applied and the state of the cell is detected with the read voltage applied. If a pass status is detected with the one or more read voltages applied, the set process is concluded. If a pass status is not detected with the one or more read voltages applied, we increase the voltage (or voltage width) and apply an additional voltage followed by a read in one or more iterations until the read passes or until a maximum allowable number of iterations are performed. An analogous reset process can use program voltages having a polarity in the reset direction (see FIG. 13).

A line 722 represents a current limit Iset_limit which may be increased in magnitude in the second programming phase. Alternatively, the set current limit could be increased step wise with the increase in the magnitude of the program pulses.

FIG. 8 depicts example voltages used in a set process, where a magnitude of the program voltages increases in first and second programming phases, three disturb voltages have a same polarity as the program voltages and a read operation is performed after the three disturb voltages.

The programming operation includes a first programming phase 800, a stability test phase 810 and a second programming phase 820. In this example, the program voltage duration instead of magnitude increases in steps. The magnitude is fixed at Vpgm_set. Optionally, both the magnitude and duration increase step wise. The first programming phase thus includes a program voltage 801 of duration $\Delta t1$ followed by a read voltage 804, a program voltage 802 of duration $\Delta t2$ followed by a read voltage 805 and a program voltage 803 of duration $\Delta t3$ followed by a read voltage 806. A program verify test is performed when each read/verify voltage is applied. In this example, the program verify test is passed with the read voltage 806.

The stability test phase includes three example disturb voltages 811, 812 and 813 where voltage 813 in this example is followed by a read voltage 814 of the stability verify test. Alternatively, each of the disturb voltages 811, 812 and 813 can be followed by a respective read voltage. These disturb voltages have a reduced magnitude compared to the program voltages 801-803 and are also shorter in duration. As before, these disturb voltages will not have a strong programming effect on the memory cell but provide a disturbance which indicates whether the memory cell is weak.

As an example, the second programming phase includes two program voltages, each followed by a read voltage. For example, a program voltage 821 of duration of duration $\Delta t4$ is followed by a read voltage 823, and a program voltage 822 of duration of duration $\Delta t5$ is followed by a read voltage 824. A program verify test is performed when each read/verify voltage is applied. In this example, the program verify test is passed with the read voltage 824 at which point the programming operation ends.

Figure 9:
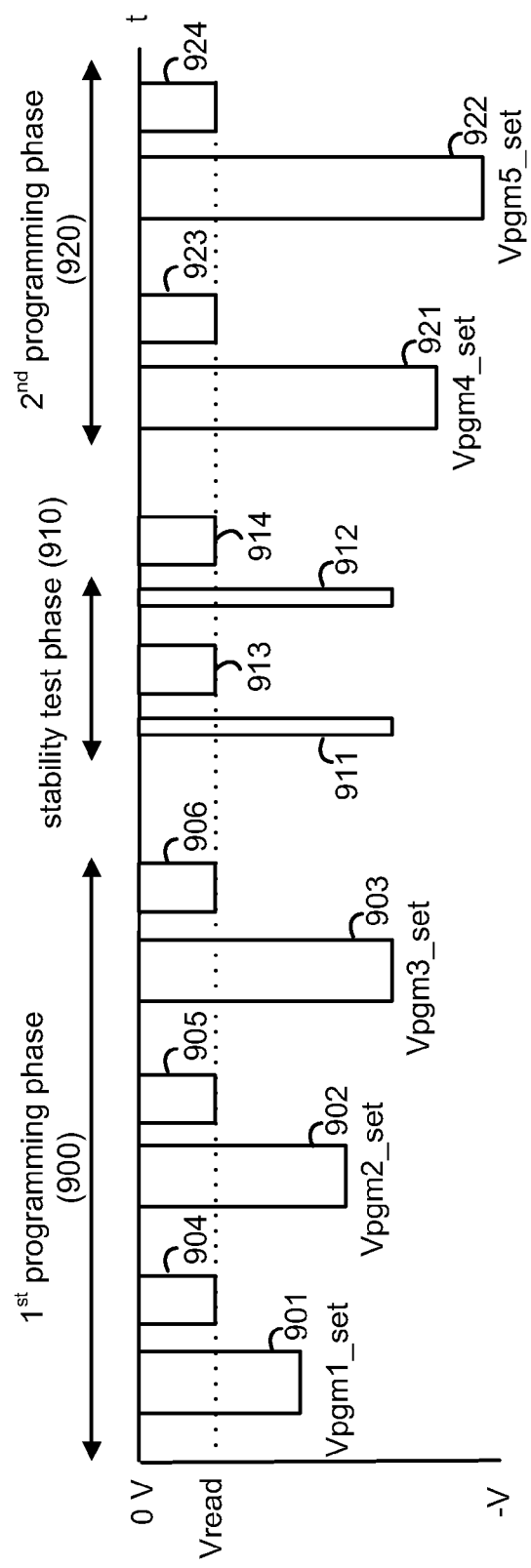
FIG. 9 depicts example voltages used in a set process, where a magnitude of the program voltages increases in first and second programming phases, two disturb voltages have a same polarity as the program voltages and a read operation is performed after each of the two disturb voltages.

FIG. 9 depicts example voltages used in a set process, where a magnitude of the program voltages increases in first and second programming phases, two disturb voltages have a same polarity as the program voltages and a read operation is performed after each of the two disturb voltages.

As mentioned in connection with FIG. 6D, it is possible to perform the stability verify test multiple times during the stability test phase and to count a number of times the stability verify test is passed or failed. Based on this, a decision can be made as to whether to end the programming operation or to begin the second programming phase.

The programming operation includes a first programming phase 900, a stability test phase 910 and a second programming phase 920. In this example, the program voltage magnitude increases in steps and the duration of each voltage is fixed. The first programming phase thus includes a program voltage 901 of magnitude Vpgm1_set followed by a read voltage 904, a program voltage 902 of magnitude Vpgm2_set followed by a read voltage 905 and a program voltage 903 of magnitude Vpgm3_set followed by a read voltage 906. A program verify test is performed when each read/verify voltage is applied. In this example, the program verify test is passed with the read voltage 906.

The stability test phase includes a first disturb voltage 911 followed by a read voltage 913, and a second voltage 912 followed by a read voltage 914. The first and second voltages have a reduced duration compared to the program voltages 901-903 and are similar in magnitude to Vpgm3_set. As before, these disturb voltages will not have a strong programming effect on the memory cell but provide a disturbance which indicates whether the memory cell is weak. Moreover, by performing multiple stability verify tests in the stability test phase, a finer grained decision can be made as to whether the second programming phase is warranted. For example, if neither of the two stability verify tests is passed, the second programming phase is warranted. If both of the two verify tests are passed, the second programming phase is not warranted. If one of the two stability verify tests is passed (and the other is failed), the second programming phase may or may not be warranted. N represents a number of passes or fails. One approach is to perform the second programming phase to provide extra assurance that the memory cell is programmed to a stable state and will not relax out of that state. This second programming phase incurs additional programming time. Another option is to provide more emphasis on a faster programming time, in which case the second programming phase is not performed when one of the two stability verify tests is passed.

An even finer grained decision can be made as to whether the second programming phase is warranted when more than two stability verify tests are performed in the stability test phase. For instance, the second programming phase may be warranted when there are zero or one passes of the stability verify test, while the second programming phase may not be warranted when there are two or three passes of the stability verify test. In another possible approach, values for the parameters can be set based on a result of the stability test phase.

In one approach, different stability tests are performed which have degrees of strictness and a decision of whether the second programming phase is warranted is based on the results of these tests. For example, if a less strict verify test is passed but a more strict verify test is failed, the second programming phase may be warranted.

As an example, the second programming phase includes two program voltages, each followed by a read voltage. For example, a program voltage 921 of magnitude Vpgm4_set is followed by a read voltage 923, and a program voltage 922 of magnitude Vpgm5_set is followed by a read voltage 924. A program verify test is performed when each read/verify voltage is applied. In this example, the program verify test is passed with the read voltage 924 at which point the programming operation ends.

A further option is to set at least one of a magnitude, a duration, or a current limit in the second programming phase based on a number $N \geq 1$ of times the memory cell fails or passes the stability verify test during the stability test phase.

Figure 10:
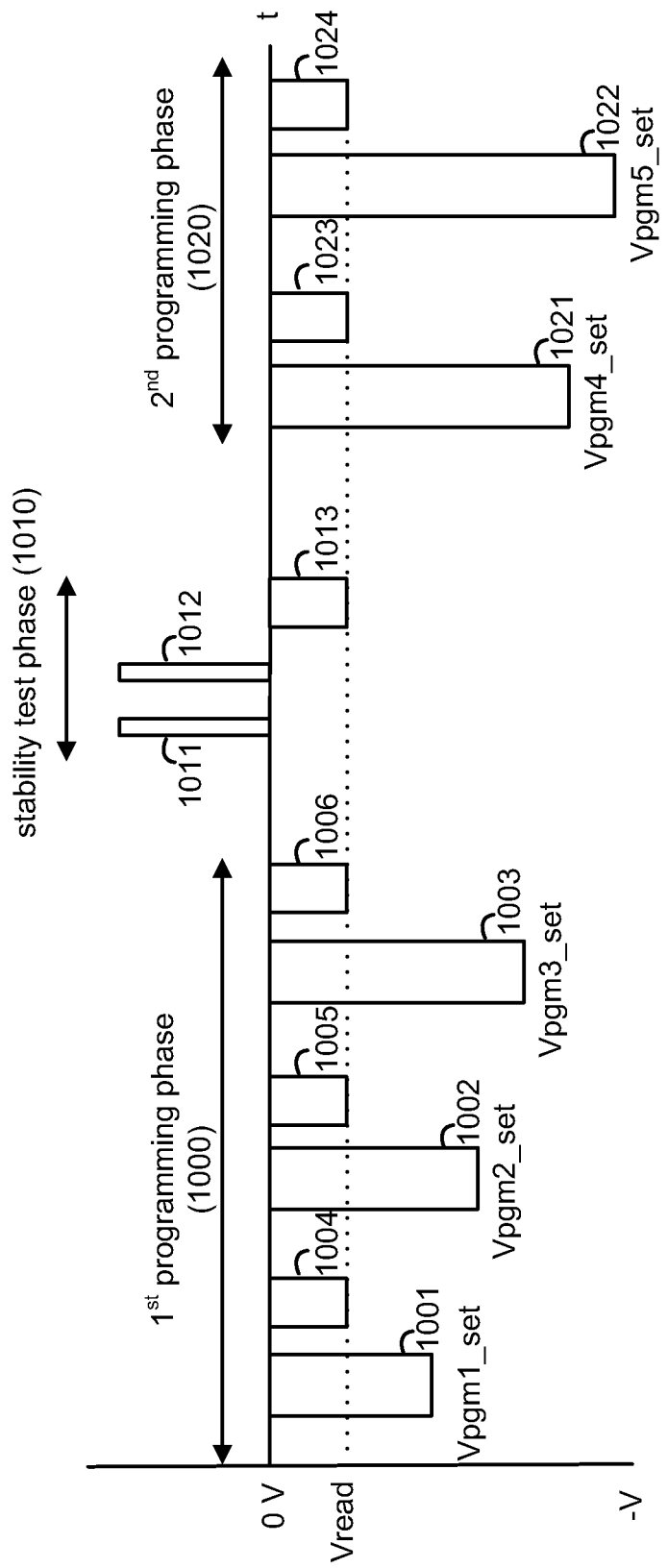
FIG. 10 depicts example voltages used in a set process, where a magnitude of the program voltages increases in first and second programming phases, two disturb voltages have an opposite polarity as the program voltages and a read operation is performed after the two disturb voltages.

FIG. 10 depicts example voltages used in a set process, where a magnitude of the program voltages increases in first and second programming phases, two disturb voltages have an opposite polarity as the program voltages and a read operation is performed after the two disturb voltages. This example is similar to the example of FIG. 7 except the disturb voltages 1011 and 1012 have an opposite (positive) polarity compared to a polarity (negative) of the program voltages in the first and second programming phases.

The programming operation includes a first programming phase 1000, a stability test phase 1010 and a second programming phase 1020. The first programming phase includes a program voltage 1001 of magnitude Vpgm1_set followed by a read voltage 1004, a program voltage 1002 of magnitude Δ Vpgm2_set followed by a read voltage 1005 and a program voltage 1003 of magnitude Vpgm3_set followed by a read voltage 1006. A program verify test is performed when each read/verify voltage is applied. The program verify test is passed with the read voltage 1006.

The stability test phase includes a first voltage 1011 and a second voltage 1012, both having a positive polarity, followed by a read voltage 1013. Optionally, the first voltage can be followed by a read pulse as well. The first and second voltages have a reduced duration and amplitude compared to the program voltage 1003.

As an example, the second programming phase includes a program voltage 1021 of magnitude Vpgm4_set followed by a read voltage 1023, and a program voltage 1022 of magnitude Vpgm5_set followed by a read voltage 1024. A program verify test is performed when each read/verify voltage is applied. The program verify test is passed with the read voltage 1024 at which point the programming operation ends.

Figure 11:
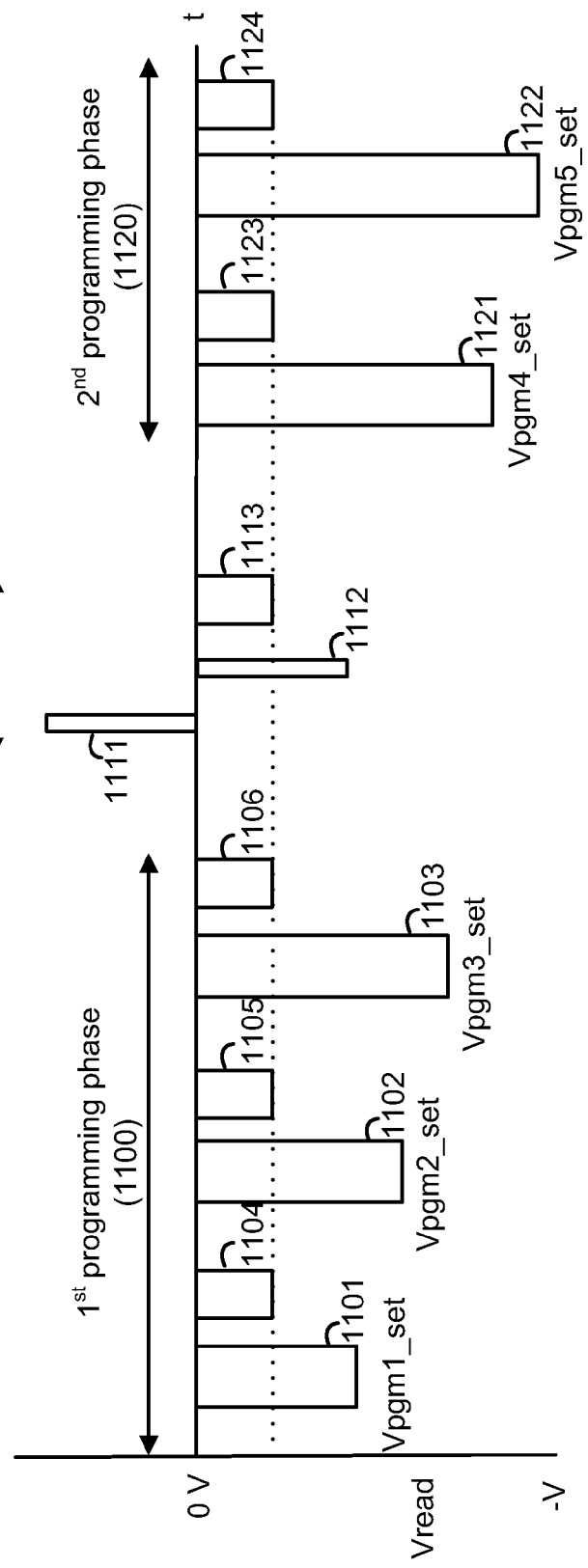
FIG. 11 depicts example voltages used in a set process, where a magnitude of the program voltages increases in first and second programming phases, two disturb voltages have different polarities and a read operation is performed after the two disturb voltages.

FIG. 11 depicts example voltages used in a set process, where a magnitude of the program voltages increases in first and second programming phases, two disturb voltages have different polarities and a read operation is performed after the two disturb voltages. This example is similar to the example of FIG. 10 except the disturb voltages 1111 and 1112 have opposite polarities. Optionally, each disturb voltage can be followed by a read pulse.

The programming operation includes a first programming phase 1100, a stability test phase 1110 and a second programming phase 1120. The first programming phase includes a program voltage 1101 of magnitude Vpgm1_set followed by a read voltage 1104, a program voltage 1102 of magnitude Δ Vpgm2_set followed by a read voltage 1105 and a program voltage 1103 of magnitude Vpgm3_set followed by a read voltage 1106. A program verify test is performed when each read/verify voltage is applied. The program verify test is passed with the read voltage 1106.

The stability test phase includes a first voltage 1111 having a positive polarity and a second voltage 1112 having a negative polarity, followed by a read voltage 1113. The first and second voltages have a reduced duration and amplitude compared to the program voltage 1103.

As an example, the second programming phase includes a program voltage 1121 of magnitude Vpgm4_set followed by a read voltage 1123, and a program voltage 1122 of magnitude Vpgm5_set followed by a read voltage 1124. A program verify test is performed when each read/verify voltage is applied. The program verify test is passed with the read voltage 1124 at which point the programming operation ends.

Figure 12:
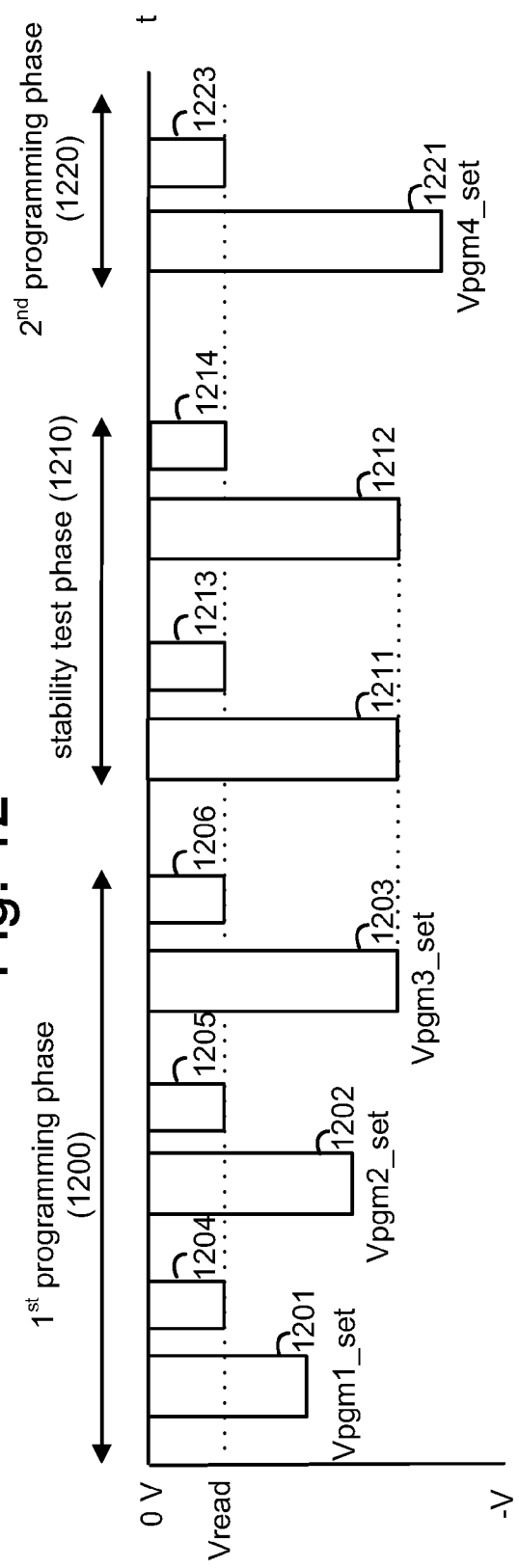
FIG. 12 depicts example voltages used in a set process, where a magnitude of the program voltages increases in first and second programming phases, and two disturb voltages are additional program voltages.

FIG. 12 depicts example voltages used in a set process, where a magnitude of the program voltages increases in first and second programming phases, and two disturb voltages are additional program voltages. In this case, the disturb voltages have a magnitude and/or duration which is comparable to the last program voltage 1203 of the first programming phase, for instance. Once the first programming phase has been completed, one or more disturb voltages are applied and one or more stability verify tests are performed in the stability test phase. Since the program voltages of the stability test phase provide a programming effect, a memory cell that fails one or both of the verify tests can be considered to be a weak cell which is highly subject to relaxing out of the programmed state and back toward its pre-programmed state. In this case, the second programming phase is warranted.

The programming operation includes a first programming phase 1200, a stability test phase 1210 and a second programming phase 1220. The first programming phase includes a program voltage 1201 of magnitude Vpgm1_set followed by a read voltage 1204, a program voltage 1202 of magnitude Δ Vpgm2_set followed by a read voltage 1205 and a program voltage 1203 of magnitude Vpgm3_set followed by a read voltage 1206. A program verify test is performed when each read/verify voltage is applied. The program verify test is passed with the read voltage 1206.

The stability test phase includes a first voltage 1211 of magnitude Vpgm3_set followed by a read voltage 1213, and a second voltage 1212 of magnitude Vpgm3_set followed by a read voltage 1214.

The second programming phase includes a program voltage 1221 of magnitude Vpgm4_set followed by a read voltage 1223. A program verify test is performed when each read/verify voltage is applied. The program verify test is passed with the read voltage 1223 at which point the programming operation ends.

Figure 13:
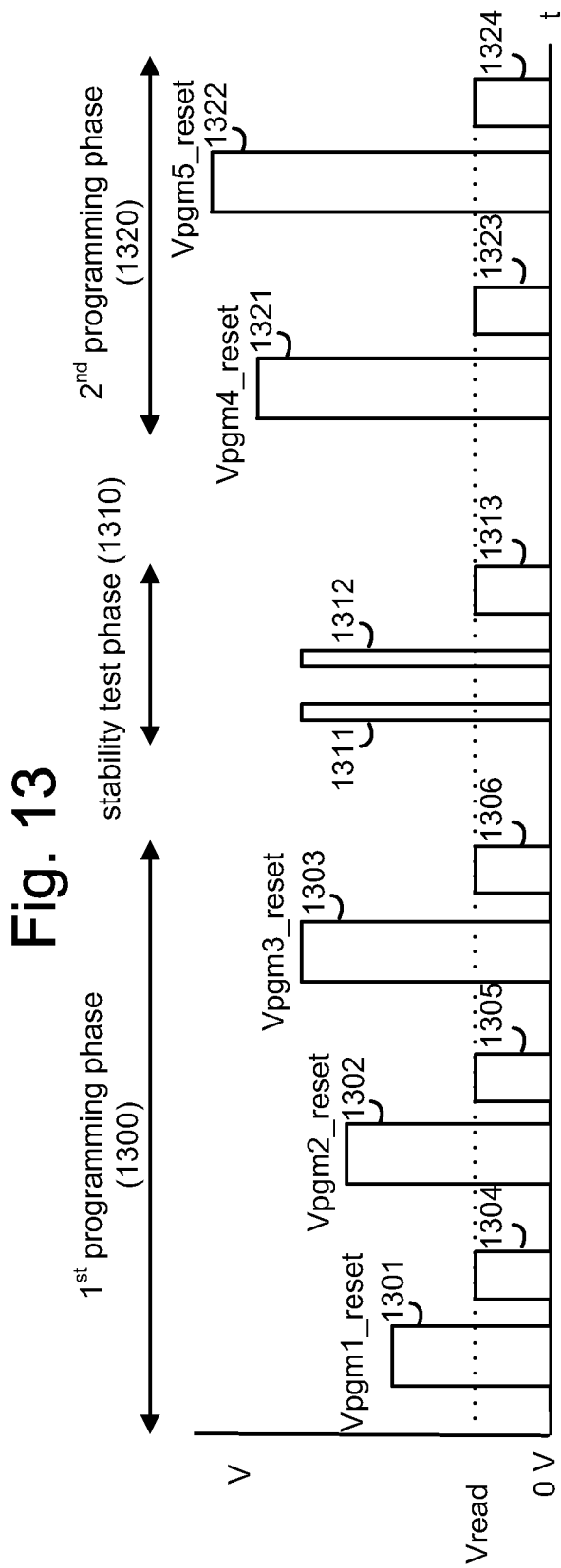
FIG. 13 depicts example voltages used in a reset process, where a magnitude of the program voltages increases in first and second programming phases, two disturb voltages have a same polarity as the program voltages and a read operation is performed after the two disturb voltages.

FIG. 13 depicts example voltages used in a reset process. However, FIGS. 7 to 13 are genially applicable to both set and/or reset processes. A magnitude of the program voltages increases in first and second programming phases, two disturb voltages have a same polarity as the program voltages and a read operation is performed after the second disturb voltage of the two disturb voltages. In this reset process, consistent with FIG. 4B, positive voltages are used for programming. This example is obtained by reversing the polarity of the voltages of the example of FIG. 7.

The programming operation includes a first programming phase 1300, a stability test phase 1310 and a second programming phase 1320. The first programming phase includes a program voltage 1301 of magnitude Vpgm1_reset followed by a read voltage 1304, a program voltage 1302 of magnitude Δ Vpgm2_reset followed by a read voltage 1305 and a program voltage 1303 of magnitude Vpgm3_reset followed by a read voltage 1306. The program verify test is passed with the read voltage 1306.

The stability test phase includes a first disturb voltage 1311 and a second disturb voltage 1312 followed by a read voltage 1313 in a stability verify test. Optionally, each disturb voltage can be followed by a read pulse.

The second programming phase includes a program voltage 1321 of magnitude Vpgm4_reset followed by a read voltage 1323 and a program voltage 1322 of magnitude Vpgm5_reset followed by a read voltage 1324. A program verify test is performed when each read/verify voltage is applied. The program verify test is passed with the read voltage 1324 at which point the programming operation ends.

Accordingly, it can be seen that, in one embodiment, a method is provided for performing an operation to change a resistance state of a memory cell. The method includes: performing a first programming phase by applying one or more program voltages to the memory cell until the memory cell passes a program verify test, the memory cell comprises a resistance-switching material; in response to the memory cell passing the program verify test in the first programming phase, performing a stability test phase by applying one or more disturb voltages to the memory cell and performing a stability verify test for the memory cell; determining whether further programming of the memory cell is warranted based on the stability test phase; and if further programming is warranted based on the stability test phase, performing a second programming phase by applying one or more program voltages to the memory cell.

In another embodiment, a memory device comprises: a resistance switching material between first and second electrodes; a first control line connected to the first electrode;

a second control line connected to the second electrode; and a control circuit connected to the first and second control lines. The control circuit, to perform a first programming phase, applies one or more program voltages to the resistance switching material until the resistance switching material passes a program verify test, in response to the resistance switching material passing the program verify test in the first programming phase, performs a stability test phase in which one or more disturb voltages are applied to the resistance switching material and a stability verify test is performed for the resistance switching material.

In another embodiment, a method for performing an operation to change a resistance state of a memory cell includes: performing a first programming phase by applying one or more program voltages to the memory cell until the memory cell passes a program verify test, the memory cell comprises a resistance-switching material; in response to the memory cell passing the program verify test in the first programming phase, performing a stability test phase by applying multiple disturb voltages to the memory cell and performing a stability verify test multiple times for the memory cell; determining a number of times the memory cell passes the stability verify test in the stability test phase; based on the number of times the memory cell passes the stability verify test in the stability test phase, determining whether further programming of the memory cell is warranted; if further programming of the memory cell is warranted, performing a second programming phase by applying one or more program voltages to the memory cell and performing the program verify test; and if further programming of the memory cell is not warranted, concluding the operation without performing the second programming phase.

The foregoing detailed description of the technology herein has been presented for purposes of illustration and description. It is not intended to be exhaustive or to limit the technology to the precise form disclosed. Many modifications and variations are possible in light of the above teaching. The described embodiments were chosen to best explain the principles of the technology and its practical application to thereby enable others skilled in the art to best utilize the technology in various embodiments and with various modifications as are suited to the particular use contemplated. It is intended that the scope of the technology be defined by the claims appended hereto.

What is claimed is:

1. A method for performing an operation to change a resistance state of a memory cell, comprising:
performing a first programming phase by applying one or more program voltages to the memory cell until the memory cell passes a program verify test, the memory cell comprises a resistance-switching material;
in response to the memory cell passing the program verify test in the first programming phase, performing a stability test phase by applying one or more disturb voltages to the memory cell and performing a stability verify test for the memory cell;
determining a number of times the memory cell passes the stability verify test in the stability test phase;
based on the number of times the memory cell passes the stability verify test is the stability test phases, determining whether further programming of the memory cell is warranted based on the stability test phase; and
if further programming is warranted based on the stability test phase, performing a second programming phase by applying one or more program voltages to the memory cell.

2. The method of claim 1, wherein:
during the stability test phase, the stability verify test is not performed until after two or more of the disturb voltages are applied.

3. The method of claim 1, wherein:
the one or more disturb voltages have at least one of a reduced magnitude or a reduced duration compared to the one or more program voltages in the first programming phase.

4. The method of claim 1, wherein:
the one or more disturb voltages have a same polarity compared to the one or more program voltages in the first programming phase and the one or more program voltages in the second programming phase.

5. The method of claim 1, wherein:
the one or more disturb voltages have an opposite polarity compared to the one or more program voltages in the first programming phase and the one or more program voltages in the second programming phase.

6. The method of claim 1, wherein:
the one or more program voltages in the second programming phase have at least one of an increased magnitude or an increased duration compared to the one or more program voltages in the first programming phase.

7. The method of claim 1, further comprising:
setting an amplitude of an initial program voltage in the second programming phase based on an amplitude of a last program voltage in the first programming phase.

8. The method of claim 1, further comprising:
setting a duration of an initial program voltage in the second programming phase based on a duration of a last program voltage in the first programming phase.

9. The method of claim 1, further comprising:
setting a larger current limit in the second programming phase than in the first programming phase.

10. The method of claim 1, further comprising:
setting at least one of a magnitude, a duration, or a current limit in the second programming phase based on a number $N>=1$ of times the memory cell fails the stability verify test during the stability test phase.

11. The method of claim 1, further comprising:
determining if the memory cell passes the program verify test in the second programming phase; and
if the memory cell passes the program verify test in the second programming phase, concluding the operation.

12. The method of claim 1, wherein:
the further programming of the memory cell is not warranted based on the stability test phase if the memory cell passes the stability verify test during the stability test phase a specified number of $N>=1$ times.

13. The method of claim 1, wherein:
the further programming of the memory cell is warranted based on the stability test phase if the memory cell does not pass the stability verify test during the stability test phase a specified number of $N>=1$ times.

14. The method of claim 1, wherein:
if further programming is not warranted based on the stability test phase, concluding the operation without performing the second programming phase.

15. The method of claim 1, further comprising:
the further programming of the memory cell is warranted based on the stability test phase if the memory cell fails the stability verify test during the stability test phase at least one time out of $N>=2$ times the stability verify test is applied.

16. The method of claim 1, wherein:
the stability verify test is less strict than the program verify test.

17. A memory device, comprising:
a resistance switching material between first and second electrodes;
a first control line connected to the first electrode;
a second control line connected to the second electrode; and
a control circuit connected to the first and second control lines, the control circuit, to perform a first programming phase, is configured to:
apply one or more program voltages to the resistance switching material until the resistance switching material passes a program verify test,
in response to the resistance switching material passing the program verify test in the first programming phase, perform a stability test phase in which one or more disturb voltages are applied to the resistance switching material and a stability verify test is performed for the resistance switching material,
determine a number of times the resistance switching material passes the stability verify test in the stability test phase, and
based on the number of times the resistance switching material passes the stability verify test in the stability test phase, determine whether further programming of the resistance switching material is warranted.

18. The memory device of claim 17, wherein:
the one or more disturb voltages have at least one of a reduced magnitude or a reduced duration compared to the one or more program voltages in the first programming phase.

19. The memory device of claim 17, wherein:
the control circuit, in response to the resistance switching material failing the stability verify test in the stability test phase, is configured to perform a second programming phase in which the control circuit applies one or more program voltages to the resistance switching material until the resistance switching material again passes the program verify test.

20. The memory device of claim 19, wherein:
the one or more disturb voltages have at least one of a reduced magnitude or a reduced duration compared to the one or more program voltages in the first programming phase and the one or more program voltages in the second programming phase.

21. The memory device of claim 17, wherein:
the stability verify test is less strict than the program verify test.

22. A method for performing an operation to change a resistance state of a memory cell, comprising:
performing a first programming phase by applying one or more program voltages to the memory cell until the memory cell passes a program verify test, the memory cell comprises a resistance-switching material;
in response to the memory cell passing the program verify test in the first programming phase, performing a stability test phase by applying multiple disturb voltages to the memory cell and performing a stability verify test multiple times for the memory cell;
determining a number of times the memory cell passes the stability verify test in the stability test phase;
based on the number of times the memory cell passes the stability verify test in the stability test phase, determining whether further programming of the memory cell is warranted;
if further programming of the memory cell is warranted, performing a second programming phase by applying one or more program voltages to the memory cell and performing the program verify test; and
if further programming of the memory cell is not warranted, concluding the operation without performing the second programming phase.

23. The method of claim 22, wherein:
further programming of the memory cell is warranted if the memory cell fails the stability verify test at least one time out of N>=2 times.

24. The method of claim 22, wherein:
the one or more disturb voltages have at least one of a reduced magnitude or a reduced duration compared to the one or more program voltages in the first programming phase and the one or more program voltages in the second programming phase.

* * * * *

UNITED STATES PATENT AND TRADEMARK OFFICE
CERTIFICATE OF CORRECTION

| | | Page 1 of 1 |
|---|---|---|
| PATENT NO. | : 8,861,258 B2 | |
| APPLICATION NO. | : 13/772729 | |
| DATED | : October 14, 2014 | |
| INVENTOR(S) | : Lan et al. | |

It is certified that error appears in the above-identified patent and that said Letters Patent is hereby corrected as shown below:

In the Claims

Claim 1, col. 21, line 16: After "test" and before "the" delete "is" and replace with -- in --.

Claim 1, col. 21, line 16: After "test" and before "determining" delete "phases," and replace with -- phase, --.

Signed and Sealed this
Tenth Day of March, 2015

Michelle K. Lee
*Deputy Director of the United States Patent and Trademark Office*